（12）United States Patent
Toda

(10) Patent No.: US 7,836,377 B2
(45) Date of Patent: Nov. 16, 2010

(54) SEMICONDUCTOR MEMORY DEVICE

(75) Inventor: Haruki Toda, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 970 days.

(21) Appl. No.: 11/625,160

(22) Filed: Jan. 19, 2007

(65) Prior Publication Data
US 2007/0198902 A1 Aug. 23, 2007

(30) Foreign Application Priority Data
Jan. 20, 2006 (JP) ............................. 2006-012648

(51) Int. Cl.
*G11C 29/00* (2006.01)
(52) U.S. Cl. ..................... 714/763; 714/752; 714/758
(58) Field of Classification Search ................. 714/763, 714/752, 758
See application file for complete search history.

(56) References Cited

U.S. PATENT DOCUMENTS 4,509,172 A * 4/1985 Chen ........................... 714/759
4,556,977 A * 12/1985 Olderdissen et al. ......... 714/782
5,107,503 A * 4/1992 Riggle et al. ................. 714/784
6,185,134 B1 2/2001 Tanaka
7,076,722 B2 7/2006 Shibata
7,096,313 B1 8/2006 Chang et al.
2006/0239073 A1 3/2006 Toda

OTHER PUBLICATIONS

U.S. Appl. No. 11/845,999, filed Aug 28, 2007, Toda.

* cited by examiner

*Primary Examiner*—Sam Rizk
(74) *Attorney, Agent, or Firm*—Oblon, Spivak, McClelland, Maier & Neustadt, L.L.P.

(57) ABSTRACT

A semiconductor memory device has a built-in error detection and correction system, wherein the error detection and correction system is formed to have a cyclic code, with which multiple error bits are correctable, and wherein the cyclic code is configured in such a manner that a certain number of degrees are selected as information bits from the entire degree of an information polynomial having degree numbers corresponding to an error-correctable maximal bit number, the certain number being a number of data bits which are simultaneously error-correctable in the memory device.

14 Claims, 29 Drawing Sheets

FIG. 5B
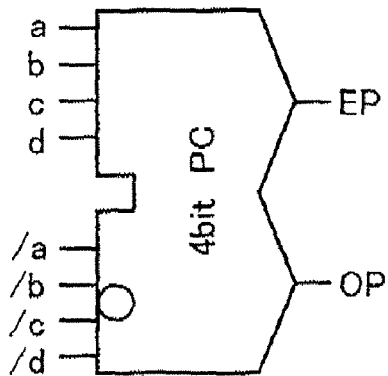
even EP="0"
odd OP="0"
FIG. 7
4 bit PC
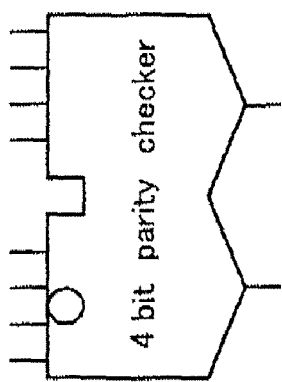
3 bit PC
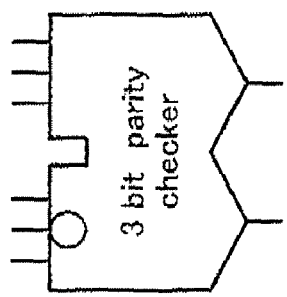
2 bit PC
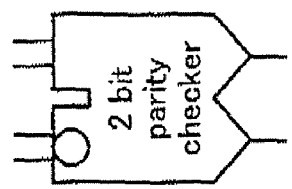

$$\nu(x) \begin{cases} \vdots \\ d_{143} \otimes P^{143}{}_7 \ P^{143}{}_6 \ P^{143}{}_5 \ P^{143}{}_4 \ P^{143}{}_3 \ P^{143}{}_2 \ P^{143}{}_1 \ P^{143}{}_0 \leftarrow p^{143}(x) \\ \oplus \\ d_{142} \otimes P^{142}{}_7 \ P^{142}{}_6 \ P^{142}{}_5 \ P^{142}{}_4 \ P^{142}{}_3 \ P^{142}{}_2 \ P^{142}{}_1 \ P^{142}{}_0 \leftarrow p^{142}(x) \\ \oplus \\ d_{141} \otimes P^{141}{}_7 \ P^{141}{}_6 \ P^{141}{}_5 \ P^{141}{}_4 \ P^{141}{}_3 \ P^{141}{}_2 \ P^{141}{}_1 \ P^{141}{}_0 \leftarrow p^{141}(x) \\ \oplus \\ d_{140} \otimes P^{140}{}_7 \ P^{140}{}_6 \ P^{140}{}_5 \ P^{140}{}_4 \ P^{140}{}_3 \ P^{140}{}_2 \ P^{140}{}_1 \ P^{140}{}_0 \leftarrow p^{140}(x) \\ \oplus \vdots \\ \vdots \\ \oplus \\ d_2 \otimes P^2{}_7 \ P^2{}_6 \ P^2{}_5 \ P^2{}_4 \ P^2{}_3 \ P^2{}_2 \ P^2{}_1 \ P^2{}_0 \leftarrow p^2(x) \\ \oplus \\ d_1 \otimes P^1{}_7 \ P^1{}_6 \ P^1{}_5 \ P^1{}_4 \ P^1{}_3 \ P^1{}_2 \ P^1{}_1 \ P^1{}_0 \leftarrow p^1(x) \\ \oplus \\ d_0 \otimes P^0{}_7 \ P^0{}_6 \ P^0{}_5 \ P^0{}_4 \ P^0{}_3 \ P^0{}_2 \ P^0{}_1 \ P^0{}_0 \leftarrow p^0(x) \end{cases}$$

$p^n(x)$ spans the $P^n$ columns.

$S_1(x) \quad \downarrow \ \downarrow \ \downarrow \ \downarrow \ \downarrow \ \downarrow \ \downarrow \ \downarrow$
$\quad\quad\quad x^7 \ x^6 \ x^5 \ x^4 \ x^3 \ x^2 \ x \ 1$

FIG. 10

$$\nu(x) \begin{cases} \vdots \\ d_{143} \otimes P^{174}{}_7\ P^{174}{}_6\ P^{174}{}_5\ P^{174}{}_4\ P^{174}{}_3\ P^{174}{}_2\ P^{174}{}_1\ P^{174}{}_0 \leftarrow p^{429}(x) = p^{174}(x) \\ \oplus \\ d_{142} \otimes P^{171}{}_7\ P^{171}{}_6\ P^{171}{}_5\ P^{171}{}_4\ P^{171}{}_3\ P^{171}{}_2\ P^{171}{}_1\ P^{171}{}_0 \leftarrow p^{426}(x) = p^{171}(x) \\ \oplus \\ d_{141} \otimes P^{168}{}_7\ P^{168}{}_6\ P^{168}{}_5\ P^{168}{}_4\ P^{168}{}_3\ P^{168}{}_2\ P^{168}{}_1\ P^{168}{}_0 \leftarrow p^{423}(x) = p^{168}(x) \\ \oplus \\ d_{140} \otimes P^{165}{}_7\ P^{165}{}_6\ P^{165}{}_5\ P^{165}{}_4\ P^{165}{}_3\ P^{165}{}_2\ P^{165}{}_1\ P^{165}{}_0 \leftarrow p^{420}(x) = p^{165}(x) \\ \oplus \\ \vdots \\ \oplus \\ d_2 \otimes P^6{}_7\ P^6{}_6\ P^6{}_5\ P^6{}_4\ P^6{}_3\ P^6{}_2\ P^6{}_1\ P^6{}_0 \leftarrow p^6(x) \\ \oplus \\ d_1 \otimes P^3{}_7\ P^3{}_6\ P^3{}_5\ P^3{}_4\ P^3{}_3\ P^3{}_2\ P^3{}_1\ P^3{}_0 \leftarrow p^3(x) \\ \oplus \\ d_0 \otimes P^0{}_7\ P^0{}_6\ P^0{}_5\ P^0{}_4\ P^0{}_3\ P^0{}_2\ P^0{}_1\ P^0{}_0 \leftarrow p^0(x) \end{cases}$$

with $d_n$ above and $p^{3n}(x)$ bracket over the P terms; outputs $S_3(x^3)$ with columns $x^7, x^6, x^5, x^4, x^3, x^2, x, 1$.

FIG. 11

| data bit | n of xn | data bit | n of xn | data bit | n of xn | data bit | n of xn |
|---|---|---|---|---|---|---|---|
| 1 | 0 | 37 | 48 | 73 | 121 | 109 | 183 |
| 2 | 1 | 38 | 49 | 74 | 126 | 110 | 185 |
| 3 | 2 | 39 | 50 | 75 | 127 | 111 | 186 |
| 4 | 3 | 40 | 51 | 76 | 128 | 112 | 187 |
| 5 | 4 | 41 | 52 | 77 | 129 | 113 | 188 |
| 6 | 5 | 42 | 53 | 78 | 130 | 114 | 191 |
| 7 | 6 | 43 | 55 | 79 | 131 | 115 | 192 |
| 8 | 7 | 44 | 64 | 80 | 132 | 116 | 193 |
| 9 | 8 | 45 | 66 | 81 | 133 | 117 | 194 |
| 10 | 9 | 46 | 67 | 82 | 134 | 118 | 195 |
| 11 | 10 | 47 | 72 | 83 | 135 | 119 | 196 |
| 12 | 11 | 48 | 73 | 84 | 136 | 120 | 198 |
| 13 | 12 | 49 | 74 | 85 | 138 | 121 | 201 |
| 14 | 13 | 50 | 75 | 86 | 140 | 122 | 202 |
| 15 | 14 | 51 | 79 | 87 | 142 | 123 | 203 |
| 16 | 15 | 52 | 85 | 88 | 143 | 124 | 205 |
| 17 | 16 | 53 | 86 | 89 | 145 | 125 | 206 |
| 18 | 17 | 54 | 87 | 90 | 146 | 126 | 208 |
| 19 | 18 | 55 | 91 | 91 | 148 | 127 | 216 |
| 20 | 21 | 56 | 94 | 92 | 149 | 128 | 218 |
| 21 | 22 | 57 | 95 | 93 | 150 | 129 | 219 |
| 22 | 25 | 58 | 98 | 94 | 151 | 130 | 221 |
| 23 | 26 | 59 | 99 | 95 | 152 | 131 | 222 |
| 24 | 27 | 60 | 100 | 96 | 154 | 132 | 223 |
| 25 | 28 | 61 | 101 | 97 | 155 | 133 | 225 |
| 26 | 31 | 62 | 102 | 98 | 159 | 134 | 226 |
| 27 | 33 | 63 | 103 | 99 | 160 | 135 | 227 |
| 28 | 34 | 64 | 104 | 100 | 164 | 136 | 237 |
| 29 | 35 | 65 | 105 | 101 | 165 | 137 | 239 |
| 30 | 36 | 66 | 106 | 102 | 170 | 138 | 240 |
| 31 | 37 | 67 | 107 | 103 | 171 | 139 | 241 |
| 32 | 38 | 68 | 108 | 104 | 172 | 140 | 242 |
| 33 | 41 | 69 | 112 | 105 | 179 | 141 | 245 |
| 34 | 45 | 70 | 118 | 106 | 180 | 142 | 249 |
| 35 | 46 | 71 | 119 | 107 | 181 | 143 | 250 |
| 36 | 47 | 72 | 120 | 108 | 182 | 144 | 253 |

| number of coefficient 1 | pn(x)=x**n mod m1(x) | | | | | | | |
|---|---|---|---|---|---|---|---|---|
| | m= 7 | 6 | 5 | 4 | 3 | 2 | 1 | 0 |
| | 56 | 66 | 59 | 57 | 58 | 66 | 65 | 62 |
| 1 | 7 | 6 | 5 | 4 | 3 | 2 | 1 | 0 |
| 2 | 11 | 10 | 9 | 8 | 8 | 8 | 9 | 8 |
| 3 | 12 | 11 | 10 | 9 | 9 | 10 | 13 | 12 |
| 4 | 13 | 12 | 11 | 10 | 11 | 12 | 14 | 13 |
| 5 | 17 | 16 | 15 | 14 | 12 | 13 | 15 | 14 |
| 6 | 22 | 21 | 18 | 17 | 16 | 15 | 22 | 18 |
| 7 | 31 | 22 | 21 | 21 | 17 | 16 | 25 | 21 |
| 8 | 35 | 31 | 22 | 28 | 18 | 18 | 26 | 25 |
| 9 | 38 | 34 | 33 | 35 | 22 | 21 | 33 | 33 |
| 10 | 41 | 37 | 36 | 38 | 27 | 26 | 34 | 36 |
| 11 | 45 | 41 | 47 | 41 | 28 | 27 | 37 | 45 |
| 12 | 46 | 45 | 53 | 48 | 34 | 33 | 46 | 46 |
| 13 | 49 | 48 | 55 | 52 | 35 | 34 | 47 | 47 |
| 14 | 55 | 64 | 66 | 64 | 37 | 35 | 48 | 50 |
| 15 | 67 | 66 | 72 | 79 | 46 | 36 | 51 | 64 |
| 16 | 73 | 67 | 79 | 85 | 49 | 38 | 64 | 66 |
| 17 | 74 | 72 | 86 | 86 | 51 | 41 | 67 | 72 |
| 18 | 79 | 73 | 87 | 87 | 53 | 46 | 73 | 74 |
| 19 | 85 | 79 | 91 | 91 | 64 | 48 | 75 | 75 |
| 20 | 86 | 85 | 94 | 100 | 73 | 49 | 85 | 86 |
| 21 | 91 | 87 | 95 | 105 | 74 | 50 | 87 | 87 |
| 22 | 95 | 94 | 101 | 106 | 75 | 52 | 91 | 91 |
| 23 | 98 | 95 | 106 | 108 | 87 | 64 | 95 | 94 |
| 24 | 103 | 98 | 107 | 119 | 103 | 72 | 98 | 98 |
| 25 | 108 | 102 | 120 | 120 | 104 | 75 | 99 | 100 |
| 26 | 112 | 107 | 121 | 121 | 105 | 85 | 101 | 104 |
| 27 | 118 | 108 | 126 | 128 | 107 | 87 | 105 | 112 |
| 28 | 119 | 118 | 130 | 131 | 120 | 99 | 118 | 118 |
| 29 | 127 | 121 | 132 | 132 | 127 | 102 | 119 | 119 |
| 30 | 128 | 126 | 133 | 134 | 130 | 104 | 120 | 120 |
| 31 | 132 | 127 | 135 | 143 | 131 | 106 | 121 | 128 |
| 32 | 134 | 131 | 138 | 146 | 132 | 118 | 126 | 129 |
| 33 | 135 | 133 | 142 | 148 | 133 | 121 | 129 | 133 |

| number of coefficient 1 | pn(x)=x**n mod m1(x) | | | | | | | |
|---|---|---|---|---|---|---|---|---|
| | m= 7 | 6 | 5 | 4 | 3 | 2 | 1 | 0 |
| | 56 | 66 | 59 | 57 | 58 | 66 | 65 | 62 |
| 34 | 140 | 134 | 148 | 150 | 134 | 126 | 130 | 135 |
| 35 | 148 | 136 | 151 | 154 | 135 | 127 | 134 | 136 |
| 36 | 149 | 143 | 154 | 155 | 136 | 128 | 136 | 138 |
| 37 | 151 | 145 | 155 | 159 | 142 | 129 | 142 | 145 |
| 38 | 160 | 148 | 159 | 165 | 145 | 130 | 146 | 150 |
| 39 | 164 | 150 | 160 | 170 | 146 | 131 | 148 | 152 |
| 40 | 165 | 152 | 171 | 171 | 151 | 133 | 151 | 154 |
| 41 | 170 | 155 | 172 | 172 | 152 | 136 | 155 | 159 |
| 42 | 171 | 159 | 181 | 180 | 154 | 140 | 159 | 165 |
| 43 | 180 | 160 | 182 | 181 | 172 | 143 | 160 | 170 |
| 44 | 183 | 164 | 185 | 185 | 179 | 145 | 164 | 171 |
| 45 | 187 | 170 | 186 | 187 | 186 | 149 | 170 | 172 |
| 46 | 188 | 172 | 188 | 193 | 187 | 150 | 171 | 179 |
| 47 | 192 | 178 | 194 | 194 | 193 | 160 | 172 | 181 |
| 48 | 196 | 182 | 195 | 201 | 196 | 164 | 179 | 185 |
| 49 | 203 | 183 | 201 | 202 | 201 | 170 | 180 | 188 |
| 50 | 205 | 186 | 202 | 206 | 218 | 180 | 182 | 191 |
| 51 | 216 | 187 | 203 | 208 | 222 | 183 | 185 | 193 |
| 52 | 222 | 191 | 205 | 219 | 223 | 185 | 186 | 198 |
| 53 | 227 | 195 | 218 | 227 | 226 | 186 | 192 | 205 |
| 54 | 237 | 196 | 225 | 239 | 237 | 187 | 194 | 206 |
| 55 | 242 | 202 | 240 | 241 | 240 | 188 | 198 | 208 |
| 56 | 245 | 203 | 242 | 242 | 241 | 195 | 205 | 216 |
| 57 | | 206 | 245 | 249 | 245 | 198 | 206 | 218 |
| 58 | | 208 | 249 | | 250 | 205 | 216 | 221 |
| 59 | | 216 | 250 | | | 219 | 218 | 223 |
| 60 | | 219 | | | | 221 | 219 | 237 |
| 61 | | 221 | | | | 225 | 222 | 245 |
| 62 | | 226 | | | | 239 | 237 | 253 |
| 63 | | 241 | | | | 240 | 239 | |
| 64 | | 245 | | | | 249 | 249 | |
| 65 | | 250 | | | | 250 | 253 | |
| 66 | | 253 | | | | 253 | | |

FIG. 17

| number of coefficient 1 | p3n(x)=x**3n mod m1(x) | | | | | | | |
|---|---|---|---|---|---|---|---|---|
| m= | 7 | 6 | 5 | 4 | 3 | 2 | 1 | 0 |
| | 58 | 55 | 73 | 54 | 53 | 64 | 59 | 71 |
| 1 | 4 | 2 | 3 | 3 | 1 | 4 | 3 | 0 |
| 2 | 8 | 4 | 5 | 7 | 3 | 5 | 5 | 4 |
| 3 | 14 | 7 | 6 | 13 | 4 | 6 | 8 | 6 |
| 4 | 15 | 10 | 7 | 14 | 6 | 7 | 11 | 7 |
| 5 | 21 | 15 | 10 | 18 | 8 | 8 | 16 | 8 |
| 6 | 27 | 16 | 11 | 26 | 9 | 9 | 17 | 11 |
| 7 | 31 | 18 | 12 | 31 | 17 | 11 | 25 | 12 |
| 8 | 33 | 22 | 13 | 35 | 25 | 12 | 27 | 13 |
| 9 | 36 | 26 | 14 | 36 | 26 | 13 | 28 | 14 |
| 10 | 37 | 27 | 21 | 38 | 28 | 14 | 31 | 15 |
| 11 | 41 | 28 | 22 | 47 | 35 | 16 | 33 | 21 |
| 12 | 45 | 34 | 26 | 50 | 37 | 25 | 35 | 22 |
| 13 | 48 | 36 | 27 | 51 | 38 | 27 | 37 | 25 |
| 14 | 51 | 37 | 28 | 53 | 45 | 31 | 38 | 27 |
| 15 | 52 | 41 | 31 | 55 | 48 | 33 | 51 | 28 |
| 16 | 55 | 50 | 38 | 67 | 49 | 34 | 53 | 41 |
| 17 | 64 | 52 | 45 | 73 | 67 | 37 | 64 | 45 |
| 18 | 72 | 53 | 46 | 98 | 74 | 38 | 66 | 46 |
| 19 | 74 | 72 | 48 | 99 | 79 | 41 | 72 | 47 |
| 20 | 79 | 73 | 49 | 103 | 86 | 47 | 73 | 49 |
| 21 | 99 | 87 | 52 | 104 | 91 | 50 | 74 | 50 |
| 22 | 100 | 95 | 53 | 105 | 94 | 52 | 79 | 53 |
| 23 | 104 | 100 | 57 | 120 | 102 | 66 | 101 | 55 |
| 24 | 105 | 101 | 75 | 121 | 104 | 73 | 102 | 66 |
| 25 | 108 | 103 | 91 | 128 | 105 | 75 | 104 | 72 |
| 26 | 112 | 107 | 95 | 129 | 108 | 91 | 108 | 79 |
| 27 | 118 | 112 | 98 | 132 | 120 | 94 | 112 | 85 |
| 28 | 121 | 119 | 99 | 135 | 129 | 98 | 118 | 91 |
| 29 | 126 | 121 | 104 | 136 | 130 | 99 | 120 | 98 |
| 30 | 129 | 126 | 105 | 138 | 133 | 101 | 127 | 99 |
| 31 | 130 | 127 | 106 | 140 | 134 | 108 | 128 | 100 |
| 32 | 133 | 135 | 107 | 142 | 152 | 112 | 136 | 105 |
| 33 | 136 | 138 | 108 | 143 | 155 | 118 | 138 | 106 |
| 34 | 140 | 143 | 112 | 145 | 159 | 119 | 142 | 107 |
| 35 | 142 | 146 | 127 | 148 | 164 | 126 | 145 | 108 |
| 36 | 143 | 148 | 129 | 152 | 165 | 127 | 148 | 112 |
| 37 | 145 | 150 | 130 | 155 | 171 | 128 | 149 | 126 |
| 38 | 146 | 155 | 131 | 183 | 179 | 132 | 151 | 128 |
| 39 | 149 | 172 | 133 | 188 | 187 | 135 | 154 | 130 |
| 40 | 154 | 180 | 134 | 196 | 193 | 145 | 159 | 131 |
| 41 | 159 | 185 | 138 | 201 | 195 | 146 | 164 | 132 |
| 42 | 164 | 186 | 142 | 202 | 196 | 148 | 181 | 134 |
| 43 | 185 | 188 | 143 | 205 | 198 | 150 | 186 | 135 |
| 44 | 191 | 192 | 150 | 206 | 202 | 151 | 187 | 138 |
| 45 | 201 | 194 | 152 | 208 | 205 | 154 | 193 | 140 |
| 46 | 202 | 196 | 154 | 221 | 208 | 160 | 195 | 142 |
| 47 | 203 | 198 | 160 | 223 | 218 | 165 | 198 | 143 |
| 48 | 206 | 202 | 165 | 225 | 219 | 179 | 201 | 148 |
| 49 | 218 | 206 | 180 | 226 | 226 | 181 | 203 | 151 |
| 50 | 221 | 222 | 181 | 227 | 237 | 182 | 205 | 155 |
| 51 | 222 | 223 | 182 | 237 | 240 | 183 | 208 | 164 |
| 52 | 225 | 226 | 183 | 240 | 249 | 186 | 221 | 170 |
| 53 | 226 | 240 | 191 | 241 | 250 | 193 | 223 | 181 |
| 54 | 227 | 241 | 192 | 253 | | 194 | 227 | 182 |
| 55 | 239 | 242 | 193 | | | 155 | 239 | 183 |
| 56 | 241 | | 194 | | | 201 | 241 | 185 |
| 57 | 242 | | 196 | | | 203 | 242 | 191 |
| 58 | 249 | | 198 | | | 208 | 249 | 192 |
| 59 | | | 201 | | | 222 | 253 | 193 |
| 60 | | | 205 | | | 226 | | 194 |
| 61 | | | 216 | | | 239 | | 195 |
| 62 | | | 218 | | | 245 | | 198 |
| 63 | | | 219 | | | 250 | | 202 |
| 64 | | | 222 | | | 253 | | 216 |
| 65 | | | 223 | | | | | 219 |
| 66 | | | 226 | | | | | 223 |
| 67 | | | 227 | | | | | 225 |
| 68 | | | 237 | | | | | 227 |
| 69 | | | 239 | | | | | 240 |
| 70 | | | 241 | | | | | 242 |
| 71 | | | 245 | | | | | 249 |
| 72 | | | 250 | | | | | |
| 73 | | | 253 | | | | | |
| 74 | | | | | | | | |

FIG. 19

SEMICONDUCTOR MEMORY DEVICE

CROSS-REFERENCE TO RELATED APPLICATION

This application is based on and claims the benefit of priority from the prior Japanese Patent Application No. 2006-012648, filed on Jan. 20, 2006, the entire contents of which are incorporated herein by reference.

BACKGROUND OF THE INVENTION

1. Field of the Invention

This invention relates generally to a semiconductor memory device and, more particularly, to an on-chip error detection and correction system adaptable for use therein.

2. Description of the Related Art

Electrically rewritable nonvolatile semiconductor memory devices include "flash" memories, which increase in error rate with an increase in number of data rewrite operations. In particular, the quest for larger storage capacity and further enhanced miniaturization results in an increase in error rate. In view of this, an attempt is made to mount or "embed" a built-in error correcting code (FCC) circuit on flash memory chips or, alternatively, in memory controllers for control of these chips. An exemplary device using this technique is disclosed, for example, in JP-A-2000-173289.

A host device side using more than one flash memory is designable to have an ECC system which detects and corrects errors occurring in the flash memory. In this case, however, the host device increases in its workload when the error rate increases. For example, it is known that a two-bit error correctable ECC system becomes greater in calculation scale, as suggested by JP-A-2004-152300.

Accordingly, in order to cope with such error rate increase while suppressing the load increase of the host device, it is desired to build a 2-bit error correctable ECC system in the flash memory. What is needed in this case is to meet the conflicting requirements: i.e., increasing the ECC system's arithmetic operation speed, and yet lessening possible penalties of read/write speed reduction of the flash memory.

SUMMARY OF THE INVENTION

According to one aspect of the present invention, there is provided a semiconductor memory device having a built-in error detection and correction system, wherein the error detection and correction system is formed to have a cyclic code, with which multiple error bits are correctable, and wherein the cyclic code is configured in such a manner that a certain number of degrees are selected as information bits from the entire degree of an information polynomial having degree numbers corresponding to an error-correctable maximal bit number, the certain number being a number of data bits which are simultaneously error-correctable in the memory device.

According to another aspect of the present invention, there is provided a semiconductor memory device having a built-in error detection and correction system, which detects and corrects 2-bit errors by use of a BCH code, wherein the error detection and correction system comprises:

an encoding part configured to generate check bits to be written into the cell array of the device together with to-be-written data;

a syndrome operating part configured to execute syndrome operation for read out data from the cell array;

an error location searching part configured to search error locations based on the operation result of the syndrome operating part; and an error correcting part configured to invert a read out data bit at an error location detected in the error location searching part, and output it, and wherein the encoding part is for dividing 254-degree data polynomial $f(x)x^{16}$ configured with to-be-written data being coefficients thereof by code generation polynomial $g(x)$ defined as a product of two 8-degree primitive polynomials $m_1(x)$ and $m_3(x)$, which are prime with each other on Galois field $GF(2^8)$, to obtain 15-degree remainder polynomial $r(x)$, thereby selecting 16 coefficients thereof as check bits, and in the encoding part, M+16 (M≦255−16=239) terms corresponding to 16 check bits and M data bits to be error-corrected are selected from the data polynomial in such a way that the calculation scale in the syndrome operating part is made as small as possible.

BRIEF DESCRIPTION OF THE DRAWINGS

FIG. 7 is a diagram showing a parity check circuit for use in such product computation.

FIG. 8 is a diagram showing a test bit calculation method in encoders in the ECC circuit.

FIG. 9 is a diagram showing a calculation method of a syndrome polynomial $S_1(x)$ in a decoder(s) of the ECC circuit.

FIG. 10 is a diagram showing a calculation method of syndrome polynomial $S_3(x^3)$ in the same.

FIG. 11 is a diagram showing 144 degrees as selected from an information polynomial in order to be used as data bits.

FIGS. 12A and 12B show, in table form, coefficients of 15-degree remainder polynomial as obtained by dividing data polynomial by code-generation polynomial.

FIG. 13 is a table of "n"s with the coefficient of each degree of the 15-degree remainder polynomial formula being of "1".

FIG. 15 is a table of n's with the coefficient of each order of "1" at the selected n's of remainder polynomial $p''(x)$ as used in calculation of the syndrome polynomial $S_1(x)$.

FIG. 17 is a table of n's with each degree coefficient "1" at chosen n's of a remainder polynomial $p^{3n}(x)$ for use in calculation of a syndrome polynomial $S_3(x^3)$.

FIG. 19 is a coefficient table of remainder polynomial $p''(x)$ as need in decoding.

DETAILED DESCRIPTION OF THE EMBODIMENTS

Figure 1:
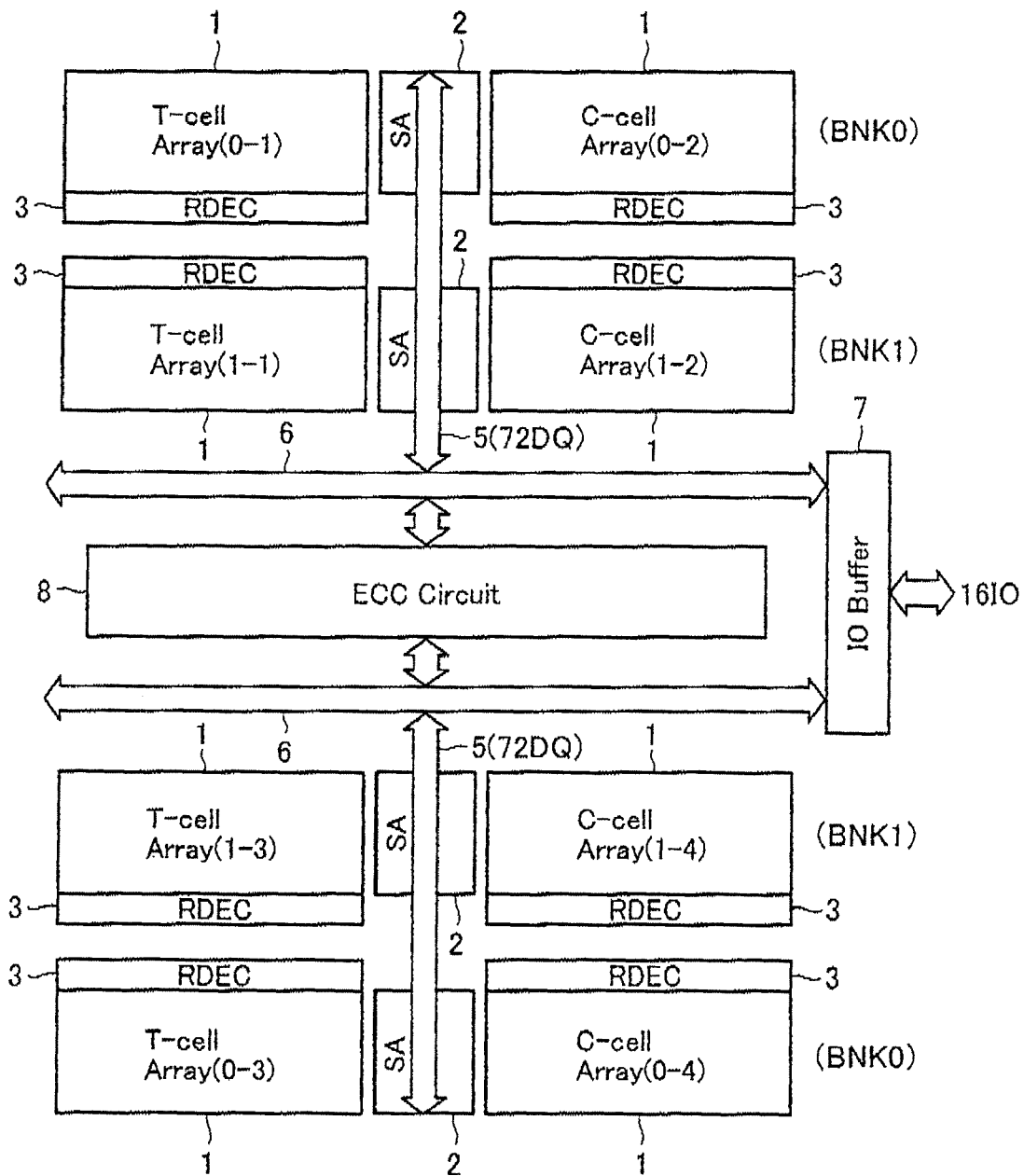
FIG. 1 is a diagram showing a configuration of main part of a flash memory in accordance with an embodiment of this invention.

Some embodiments of this invention will be described with reference to the accompanying figures of the drawing below.

Referring to FIG. 1, there is illustrated a block diagram showing main parts of a flash memory embodying the invention. This flash memory includes a couple of banks BNK0 and BNK1. Bank BNK0 is formed of four separate memory cell arrays 1—i.e., T-cell array (0-1), C-cell array (0-2), T-cell array (0-3), and C-cell array (0-4). The other bank BNK1 also is formed of four cell arrays 1, i.e., T-cell array (1-1), C-cell array (1-2), T-cell array (1-3), and C-cell array (1-4).

Each cell array 1 is associated with a row decoder (RDEC) 3 for performing word-line selection. Sense amplifier (SA) circuits 2 are provided, each of which is commonly owned or "shared" by neighboring T-cell array and C-cell array. These T-cell and C-cell arrays have a plurality of information cells, T-cells and C-cells, respectively, each having at least one reference cell R-cell as will be described later in detail.

The information cells T-cell and C-cell are the same in structure as the reference cell R-cell. Upon selection of an information cell T-cell from T-cell array, a reference cell R-cell is selected from a C-cell array that makes a pair with this T-cell array. Similarly, when an information cell C-cell is selected from C-cell array, a reference cell R-cell is selected from a T-cell array that makes a pair therewith.

Read/write data of upper and lower cell array groups each having four separate cell arrays 1 are transferred between sense amplifier circuits 2 and external input/output (I/O) nodes through data buses 5 and 6 via an I/O buffer 7. Between the upper and lower cell array groups each having four cell arrays 1, an error correcting code (ECC) circuit 8 is provided as an error detection and correction system, which is operable to detect and correct errors of read data.

Figure 2:
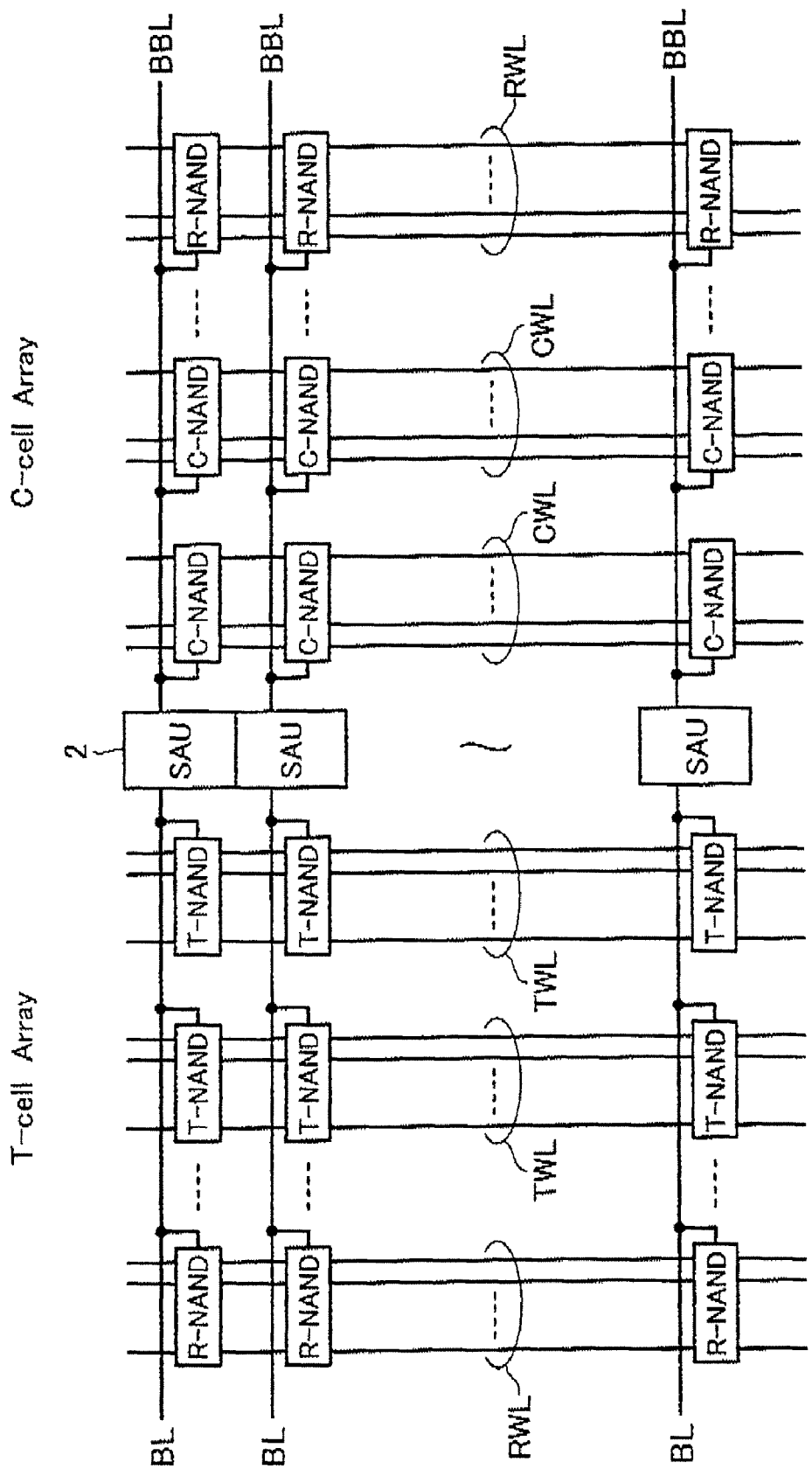
FIG. 2 is a diagram showing a detailed arrangement of a cell array in the flash memory.

Referring next to FIG. 2, a detailed configuration of a pair of T-cell array and C-cell array with their shared sense amp circuit 2 is shown. T-cell array has parallel extending bit lines BL, each of which is connected to a plurality of information cell NAND strings, T-NAND, and at least one reference cell NAND string, R-NAND. Similarly C-cell array has parallel bit lines BBL, to each of which are connected a plurality of information cell NAND strings, C-NAND, and at least one reference cell NAND string, R-NAND. Bit line BL of T-cell array and its corresponding bit line BBL in C-cell array constitute a pair.

The sense amp circuit 2 has sense units SAU of a current detection type, each of which is for detecting a difference between currents flowing in a pair of bitlines BL and BBL to sense data. Although in FIG. 1 a sense unit SAU is disposed one by one between paired bit lines BL and BBL, there is usually employed a scheme for causing a single sense unit to be shared by more than two bit line pairs.

A prespecified number of serial combinations of the information cell NAND strings T-NAND, C-NAND and reference cell NAND string R-NAND are laid out in the direction at right angles to the bitlines, thereby constituting cell blocks. In the respective cell blocks, word lines TWL, CWL and RWL are disposed. More specifically, these cell blocks each has a plurality of groups of parallel word lines which insulatively cross or "intersect" the bit lines BL and BBL—i.e., bundles of word lines TWL associated with respective columns of information cell NAND strings T-NAND, sets of wordlines CWL connected to respective columns of information cell NAND strings C-NAND, and wordlines coupled to each column of reference cell NAND strings R-NAND.

Figure 3:
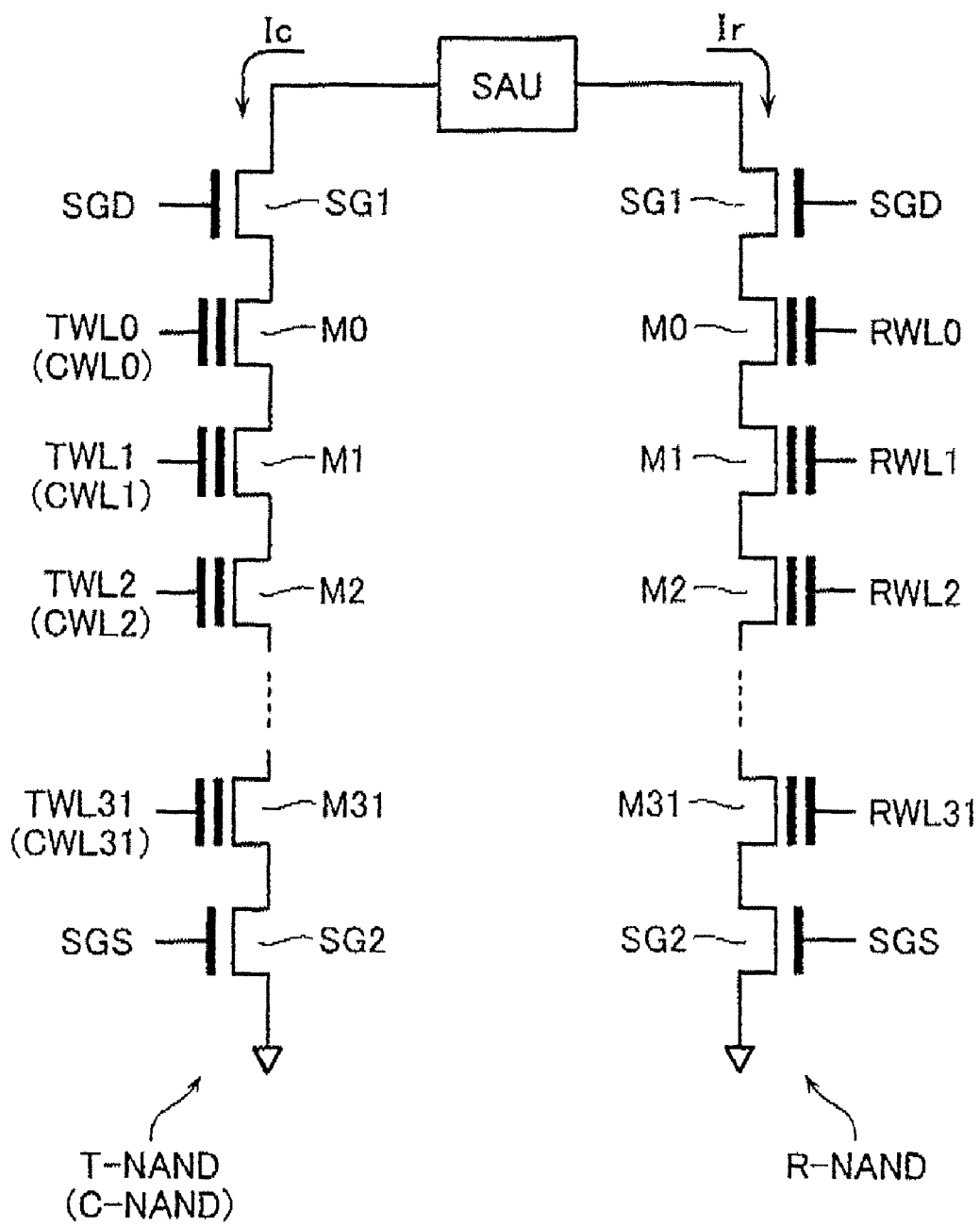
FIG. 3 is a diagram showing a further detailed configuration of the cell array.

FIG. 3 shows a detailed configuration of circuitry which includes a one sense unit SAU and an information cell NAND string T-NAND (or C-NAND) and a reference cell NAND string R-NAND as connected to the sense unit. Each of these NAND strings has a serial connection of electrically rewritable nonvolatile memory cells M0 to M31 and a couple of select transistors SG1 and SG2 at opposite ends thereof. While the nonvolatile memory cells M0-M31 used are the same in transistor structure, these may function as the information cells T-cell. (or C-cell) in information cell NAND string T-NAND (or C-NAND) or act as the reference cell R-cell in reference cell NAND string R-NAND.

In a data sense event, a memory cell of the information cell NAND string T-NAND (or C-NAND) and its corresponding cell in reference cell NAND string R-NAND are selected together at a time. This simultaneous data/reference cell selection results in currents Ic and Ir flowing in these cell strings, respectively. The sense unit SAU detects a difference between these cell currents Ic and Ir to sense data.

Figure 4:
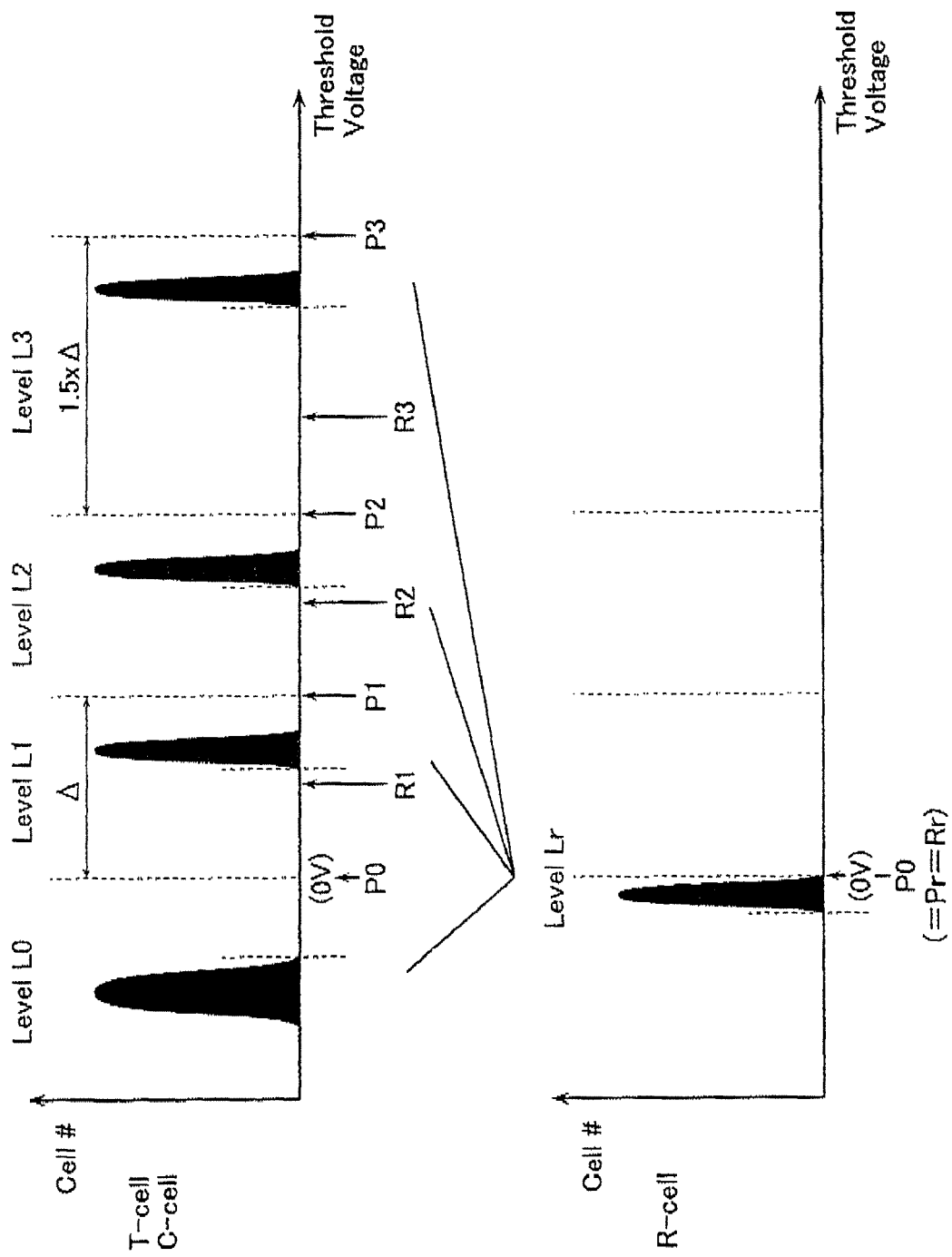
FIG. 4 is a diagram showing a data level relationship of the flash memory.

FIG. 4 shows a distribution of memory cell data levels (threshold levels) in case of four-level storage scheme. Any one of four different data levels L0, L1, L2 and L3 is written into an information cell T-cell, C-cell. A reference level Lr is written into reference cell R-cell, which level is set to have a potential between the data levels L0 and L1 for example.

Bit allocation of four data levels L0-L3 is different between the information cells T-cell and C-cell. For example, suppose that four-level data is represented by (HB, LB), where HB is the upper-level bit; and LB lower-level bit. In an information cell T-cell on the T-cell array side, data bits are assigned as follows: L0=(1,0), L1=(1,1), L2=(0,1), and L3=(0,0). While, in an information cell C-cell on the C-cell array side, data bits are assigned as follows: L0=(0,0), L1=(0,1), L2=(1,1), and L3=(1,0).

In FIG. 4, there are shown read voltages R1 to R3 given to information cell T-cell, C-cell during reading in al way pursuant to the data to be read, and a read voltage Rr as applied to reference cell R-cell. Also shown here are write-verify voltages P1 to P3 to be given to the information cell T-cell, C-cell during write-verifying, and a write-verify voltage Pr applied to the reference cell R-cell.

An explanation will now be given of a technique used in this embodiment for mounting the ECC circuit 8 and its access mode in a case where a 1 gigabit (Gb) of memory is configured using two 512-megabit (Mb) banks BNK0 and BNK1.

The memory as discussed here is of a ×16-IO configuration, in which address generation is in common to all the banks although each bank's page address is settable independently and wherein allocation is made to each bank by designating which page address is applied to which bank. Accordingly, interleaving is done between the banks for page address utilization.

Each bank has 1,024 k pages. The page length defined in common for 16 IOs of each bank is 32 bits, which may be output 8 bits by 8 bits in a parallel way. The page length is the maximum or "longest" data length per bank with respect to one IO readable by a sense operation with one-time wordline address setting.

With such an arrangement, 128 bits of data are output outside by one-time data transmission from the sense amp circuit 2. In other words, this design permits $2^k$ data bits to be transferred together, where k is an integer.

The ECC circuit 8 built in the flash memory is arranged to employ Bose-Chaudhuri-Hocquenghem (BCH) code with 2-bit error correctability—that is, double error correction BCH code system, which will be referred to as "2EC-BCH" code hereinafter. To enable 2-bit error correction, a need is felt to use a simultaneous equation having different roots. The 2EC-BCH code is a cyclic code generated with a code generation polynomial as denoted by a product of two primitive polynomials.

The bit length used here is given by $2^n-1$. Data bits usable as information are $2^n-1-2n$ bits. To deal with $2^m$ bits of data, let n=m+1. This makes it inevitable to use a data length that is approximately two times greater than the quantity required.

In the memory configuration of FIG. 1, 2EC-BCH code used for execution of 2-bit error correction in 128-bit information data is on Galois field $GF(2^8)$. In this case, usable bit length is $2^8-1=255$, which requires the use of 16 bits as error check bits. Thus, in case 144 bits are used for 16 check bits and 128 information data bits, the remaining 111 bits become extra ones. In this case, as shown in FIG. 1, the data buses 5 extending from upper and lower cells which bisect each bank are 72 DQ lines, respectively, resulting in a total of 144 bits of data being transferred together at a time.

The ECC system is variable in efficiency depending upon the handling of useless extra 111 bits and how information bit selection is performed in the BCH code system. Thus, it is necessary to take into consideration a method for configuring the best suited ECC system.

Although in some cases the required bit number becomes greater than 128 bits when considered also including the redundancy for replacement of a defective cell(s), this may readily be analogously extendable from the case of the 128-bit data length discussed here. In general, M data bit numbers to be error-corrected in the 2EC-BCH system is selected in the range of $M \leq 255-16=239$.

(Data Encoding)

An explanation will be given of the outline of 2EC-BCH on Galois field $GF(2^8)$. Letting a primitive root (element) of GF(256) be $\alpha$, 8-degree primitive polynomial $m_1(x)$ on the ground field GF(2) with this element α being as its own root is represented by Expression 1. In other words, irreducible polynomials of a power of α and a power of x due to $m_1(x)$ become mutually corresponding elements of GF(256).

Additionally, as an 8-degree irreducible polynomial with as a cubic of α being as its root, polynomial $m_3(x)$ that is relatively prime with $m_1(x)$ is used as shown in Expression 1.

$$\alpha: m_1(x)=x^8+x^4+x^3+x^2+1$$

$$\alpha^3: m_3(x)=x^8+x^6+x^5+x^4+x^2+x+1 \quad [\text{Exp. 1}]$$

Based on these two primitive polynomials, a 2-bit error correctable ECC system (i.e., 2EC-BCH code system) will be configured. To perform encoding with check bits added to the data being written, prepare a product polynomial g(x) of $m_1(x)$ and $m_3(x)$ as a code generation polynomial, as shown in Expression 2 below.

$$g(x)=m_1(x)m_3(x)=x^{16}+x^{14}+x^{13}+x^{11}+x^{10}+x^9+x^8+x^6+x^5x+1 \quad [\text{Exp. 2}]$$

A maximal number of two-bit error correctable bits capable of being utilized as information bits is 239, which is equal to $2^8-1$ (=255) with a check bit number 16 being subtracted therefrom (i.e., 255−16=239). Based on these bits, while letting coefficients from bit positions 16 to 254 be $a_{16}$ to $a_{254}$, make a 238-degree information polynomial f(x) as indicated by Expression 3.

$$f(x)=a_{254}x^{238}+a_{253}x^{237}+\ldots+a_{18}x^2+a_{17}x+a_{16} \quad [\text{Exp. 3}]$$

For example, 128 bits are actually used in the 239 terms. In this case, letting the remaining coefficients of 111 bits be fixed to "0", the information polynomial becomes one with the lack of those terms of corresponding degrees. Depending upon which degree numbers are selected as the 111 terms with such "0"-fixed coefficients from the information polynomial f(x) having 239 terms, the computation amount of syndrome calculation to be executed during decoding as will be later described. Thus, this selection technique becomes important. This will be explained later.

From the information polynomial f(x), form a data polynomial $f(x)x^{16}$ that contains 16 check bits. To make such check bits from this data polynomial, the data polynomial $f(x)x^{16}$ will be divided by the code generation polynomial g(x) to obtain 15-degree remainder polynomial r(x) as shown in the following Expression 4.

$$f(x)x^{16}=q(x)g(x)+r(x)$$

$$r(x)=b_{15}x^{15}+b_{14}x^{14}+\ldots+b_1x+b_0 \quad [\text{Exp. 4}]$$

Use the coefficients $b_{15}$ to $b_0$ of this remainder polynomial r(x) as the check bits. In other words, 128 coefficients $a_{i(128)}$ to $a_{i(1)}$ selected from 239 ones serve as "information bits" while 16 bits of $b_{15}$ to $b_0$ serve as "check bits", thereby resulting in that a total of 144 bits become "data bits" to be stored in the memory as shown in Expression 5.

$$a_{i(128)}a_{i(127)}\ldots a_{i(3)}a_{i(2)}a_{i(1)}b_{15}b_{14}\ldots b_1b_0 \quad [\text{Exp. 5}]$$

Here, $a_{1(k)}$ is the data to be externally written into the memory. Based on this data, a check bit $b_j$ is created in the chip-embedded ECC system, which bit will be simultaneously written into the cell array.

(Data Decoding)

Next, an explanation will be given of a method for detecting errors from 144 bits of data read out of the cell array and for correcting up to 2 bits of errors.

Supposing errors take place when the memory stores the coefficients of a 254-degree data polynomial $f(x)x^{16}$, such errors also are expressed by 254-degree polynomial. Letting this error polynomial be e(x), the data read from the memory may be given by a polynomial v(x) with a structure shown in Expression 6 as follows.

$$v(x)=f(x)x^{16}+r(x)+e(x) \quad [\text{Exp. 6}]$$

A term with the coefficient of this error polynomial e(x) in Expression 6 being at "1" is identical to an error. In other words, detecting e(x) is equivalent to performing error detection and correction.

What is to be done first is to divide the readout data polynomial v(x) by the primitive polynomials $m_1(x)$ and $m_3(x)$ to obtain respective remainders, which are given as $S_1(x)$, $S_3(x)$. As shown in Expression 7, it is apparent from the structure of v(x) that each is equal to a remainder of e(x) divided by $m_1(x)$, $m_3(x)$.

$$v(x) \equiv S_1(x) \bmod m_1(x) \rightarrow e(x) \equiv S_1(x) \bmod m_1(x)$$

$$v(x) \equiv S_3(x) \bmod m_3(x) \rightarrow e(x) \equiv S_3(x) \bmod m_3(x) \quad [\text{Exp. 7}]$$

These division remainders $S_1(x)$ and $S_3(x)$ are referred to as syndrome polynomials.

Assuming that 2-bit errors are present at i-th and j-th bits, $e(x)=x^i+x^j$. These values i and j are obtainable by calculation of an irreducible remainder polynomial relevant to $m_1(x)$ that is an element of GF(256) More specifically, when letting $x^n \equiv p''(x) \bmod m_1(x)$, let each remainder $p^i(x)$, $p^j(x)$ corresponding to the degree number of the error be $X_1$, $X_2$, while letting each remainder $p^{\sigma 1}(x)$, $p^{94\ 3}(x)$ corresponding to $S_1(x)$, $S_3(x^3)$ for the syndrome polynomial $S_1(x)$, $S_3(x)$ be set to $S_1$, $S_3$ as shown in Expression 8.

$$X_1 = p^i(x) \equiv x^i \bmod m_1(x)$$

$$X_2 = p^j(x) \equiv x^j \bmod m_1(x)$$

$$S_1 = p^{\sigma 1}(x) \equiv S_1(x) \bmod m_1(x)$$

$$S_3 = p^{\sigma 3}(x) \equiv S_3(x) \bmod m_1(x)$$

In view of the fact that $m_3(x^3)$ has $\alpha$ as its root and is just dividable by $m_1(x)$, we obtain the following Expression 9.

$$S_1 = X_1 + X_2 \equiv x^i + x^j \equiv e(x) \bmod m_1(x)$$

$$S_3 = X_1^3 + X_2^3 \equiv x^{3i} + x^{3j} \equiv e(x^3) \bmod m_1(x) \quad [\text{Exp. 9}]$$

At the second stage, consider a polynomial $\Lambda^R(x)$ with unknown quantities $X_1$ and $X_2$ as its roots, a product $X_1 X_2$ is representable by $S_1$ and $S_3$ as in Expression 10, so that the coefficients involved are calculable from the syndrome polynomials.

$$S_3/S_1 = (X_1^3 + X_2^3)/(X_1 + X_2) = X_1^2 + X_1 X_2 + X_2^2 = (X_1 + X_2)^2 + X_1 X_2 = S_1^2 + X_1 X_2$$

$$X_1 X_2 = (S_3 + S_1^3)/S_1$$

$$\Lambda^R(x) = (x - X_1)\cdot(x - X_2) = x^2 + S_1 x + (S_3 + S_1^3)/S_1 \quad [\text{Exp. 10}]$$

At the third stage, find the $\Lambda^R(x)$'s irreducible polynomial $p''(x)$ that becomes a root in GF(256). This makes it possible to obtain from $X_1$, $X_2 = p''(x)$ the error bit locations i and j as n of $p''(x)$. In short, search $\Lambda^R(x) \equiv 0 \bmod m_1(x)$ for n=0, 1, 2, ..., 254 to specify a hit number "n" as an error bit.

As shown in Expression 11 below, in case of a 1-bit error, we obtain $X_1 = S_1$, $X_1^3 = S_3 = S_1^3$. Thus, the error location is defined from $S_1$. If there are no errors, we obtain $S_1 = S_3 \equiv 0$ (mod $m_1(x)$). In case there are 3 bits or more errors and its position is incomputable, either one of $S_1$ and $S_3$ becomes 0 (mod $m_1(x)$).

(a) If 1-bit error, $X_1 = S_1$ and $X_1^3 \equiv S_3 \equiv S_1^3$.

(b) If 0-bit error, $S_1 = S_3 \equiv 0 \bmod m_1(x)$.

(c) If more than 3-bit error, $S_1$ or $S_3$ is equal to 0 mod $m_1(x)$. [Exp. 11]

Essentials for execution of actual calculations are summarized as follows.

What is needed in encoding is a table of remainders, i.e., a table of coefficients of remainder polynomial r(x) generated by code generation polynomial g(x) with 128 terms as selected as data bits from the data polynomial $f(x)x^{16}$ of degree 254 in maximum. For check bit calculation, select those coefficients corresponding to the data bit-selected terms, followed by execution of addition on GF(2) using binary codes of either "0" or "1".

In decoding, when performing calculation of the syndrome polynomials $S_1(x)$ and $S_3(x^3)$, a remainder table is necessary which is a table of coefficients of remainder $p''(x)$ obtained by primitive polynomial $m_1(x)$ from 254 to 0 degree. From this table the calculation is done as similar to the check bit calculation.

To shorten an ECC calculation time in a memory system which does not use all of the 239 data bits usable in 2EC-BCH using GF(256), it is in need of employing a practical selection method for selecting the actually used terms (degrees) from the information polynomial. Especially for the syndrome calculation, it is necessary to choose specific terms (degrees) capable of efficiently obtaining the remainder.

An explanation will first be given of a practically implemented remainder calculation method.

In calculations on GF(2), both multiplication and division are carried out by addition of polynomial coefficients—that is, based on even/odd judgment of the numbers of "1". Thus a calculator circuit used here is principally designed to perform parity check in a way as follows: if the number of terms, coefficient of which is "1", is an even number, output a computation result "0"; if it is an odd number then its calculation result becomes "1".

Figure 5A:
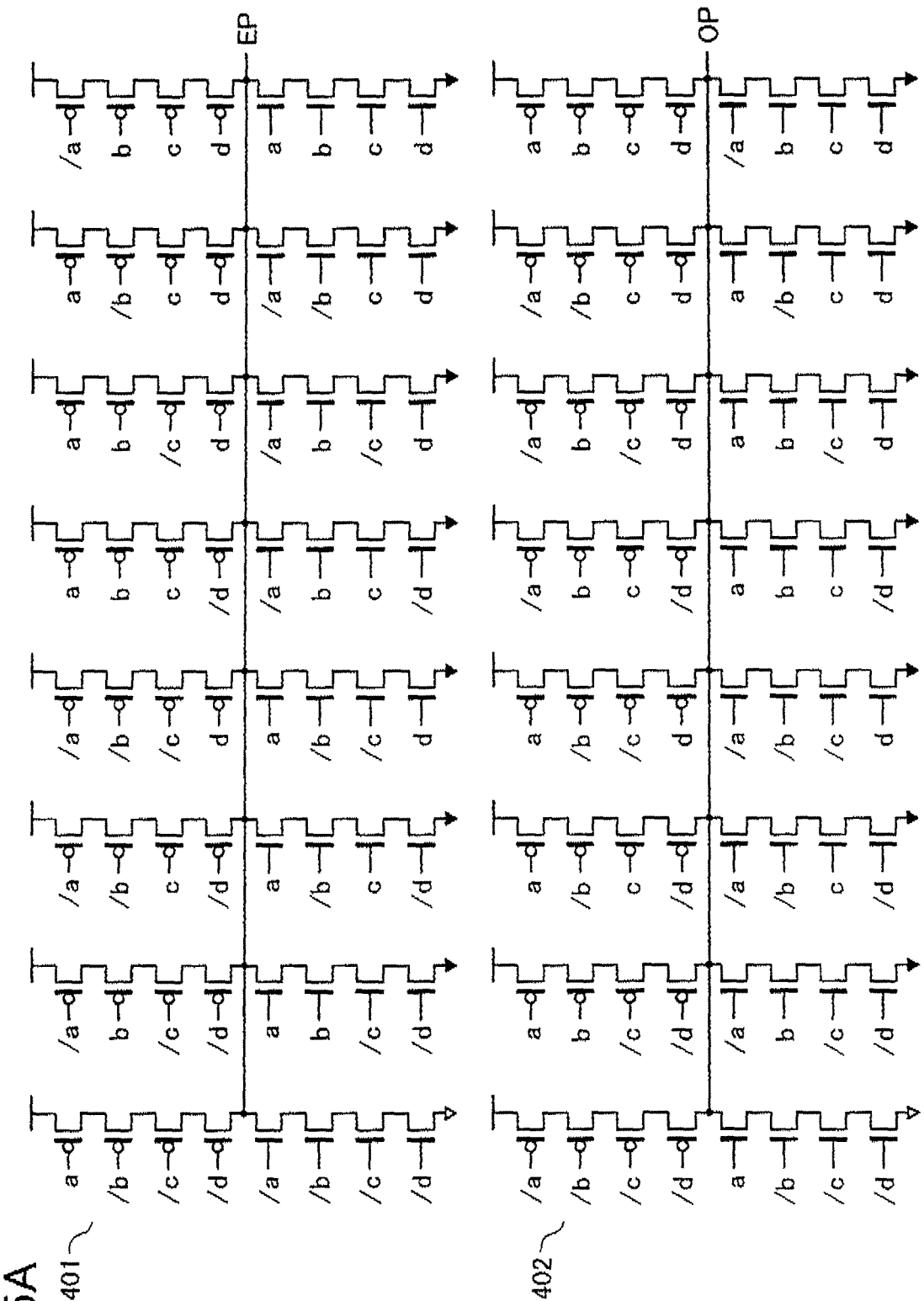
FIG. 5A is a diagram showing a 4-bit parity check circuit as used in an ECC circuit for performing even/odd judgment of "1"; and, FIG. 5B is a diagram showing symbols of the parity checker circuit.

A 4-bit parity check (PC) circuit with a simplified configuration is shown in FIG. 5A, a circuit symbol of which is shown in FIG. 5B. While parity checkable circuitry with various configurations is designable and modifiable on a case-by-case basis, the illustrative circuit is arranged to have parity-check logic units made up of transistors only for purposes of convenience in illustration and discussion herein.

This parity check circuit includes an upper-stage circuit 401 which receives at its inputs four bits a, b, c, d and their complementary signals /a, /b, /c, /d and generates "0" at an output node EP exclusively when an even number of "1"s are in the input signals, and a lower-stage circuit 402 which generates "0" at its output node OP only when an odd number of "1"s are in the input signals thereof. These circuits 401-402 are formed of eight parallel-connected gates between the power supply voltage Vdd and ground potential Vss, each of which gates has four 4-bit input PMOS transistors and NMOS transistors.

More specifically, the upper-stage circuit 401 is such that when its "1" inputs are 0, 2 or 4 in number, NMOS transistors on the Vss side are rendered conductive, causing the EP's potential to be "0" (EP="0"). For the lower-stage circuit 402, when the number of its inputs "1"s is 1 or 3, the Vss-side NMOS transistors turn on, resulting in establishment of OP="0".

With this parity check circuit, 4-bit parity check is calculable within a shortened delay time, which is equivalent to that of a single stage of inverter.

Figure 6:
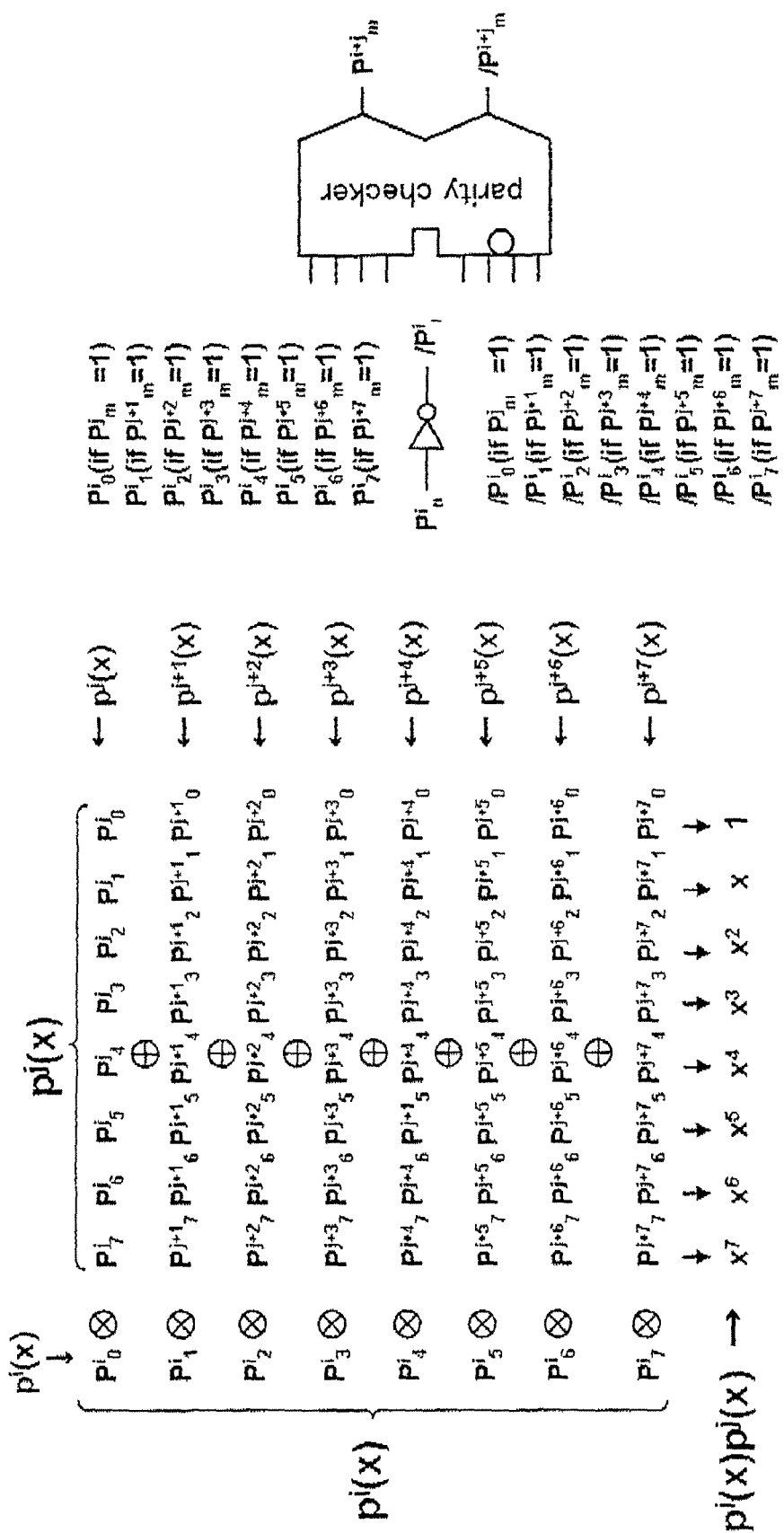
FIG. 6 is a diagram showing a product computation method of polynomials on GF(2).

A calculation method of a product on GF(2) of the polynomial of GF(256) using the above-described parity check circuit is shown in FIG. 6. Every arithmetic processing of the polynomial of GF(256) becomes computation between 7-degree polynomials $p''(x)$ because the primitive polynomial is of degree 8. Thus, every calculation result of four operations—i.e., addition, subtraction, multiplication and division—becomes any one of the polynomials $p''(x)$. Division $\{p''(x)\}^{-1}$ becomes a product of $p^{255-n}(x)$.

While letting the coefficient of m-degree term of $p''(x)$ be represented by $P''_m$, a product of 7-degree polynomials $p^i(x)$ and $p^j(x)$ in Expression 12 below is calculated as shown in FIG. 6. Obviously, the coefficient $p''_m$ is either "0" or "1".

$$p^i(x) = P^i_7 x^7 + P^i_6 x^6 + P^i_5 x^5 + P^i_4 x^4 + P^i_3 x^3 + P^i_2 x^2 + P^i_1 x + P^i_0$$

$$p^j(x) = P^j_7 x^7 + P^j_6 x^6 + P^j_5 x^5 + P^j_4 x^4 + P^j_3 x^3 + P^j_2 x^2 + P^j_1 x + P^j_0 \quad \text{[Exp. 12]}$$

As $x^n \equiv p''(x) \pmod{m_1(x)}$, use such a rule that the 14-degree term is with $p^{j+7}$ appearing 7-item ahead of the multiplying $p^j(x)$. Then, the product of polynomials $p^i(x)$ and $p^j(x)$ is enabled by multiplication and addition (i.e., parity check) between the respective polynomial coefficients as to shown in FIG. 6.

In other words, parity check is done which is per-degree addition of from 7 to 0 of 1- or 0-multiplied ones, and its result becomes the coefficient of each degree of $p^i(x)p^j(x)$. Regarding the multiplying $p^j(x)$, there are required those polynomial coefficients up to a 7-degree ahead one.

The circuitry required here may be the parity check circuit only, with additional provision of a circuit for performing inputting unique to the coefficients of from the multiplying $p^j(x)$ to $p^{j+7}(x)$. This is because no parity check is needed when the coefficient $P^j_m = 0$. As shown in FIG. 7, the parity check circuit is modifiable to employ 3-bit parity check circuit, 2-bit parity check circuit other than the 4-bit parity check circuit in accordance with input number needed.

This computation method is applied upon generation of the check bits during encoding, which will be explained below.

The check bit calculation is performed by dividing data polynomial $f(x)x^{16}$ that was created from information data by code generation polynomial $g(x)$ to obtain remainder polynomial $r(x)$. To perform this arithmetic operation, precalculate coefficients of 15-degree remainder polynomial $r^i(x)$ which was obtained by dividing $x^i$ of a single term by $g(x)$, and use them in a similar way to the case of the multiplication of $p''(x)$. The coefficient of $r^i(x)$ is referred to as $R^i_m$ ($m=0, 1, 2, \ldots, 15$), and the coefficient of $x^i$ of $f(x)x^{16}$, which serves as an information bit, is referred to as $a_i$.

Figure 8:
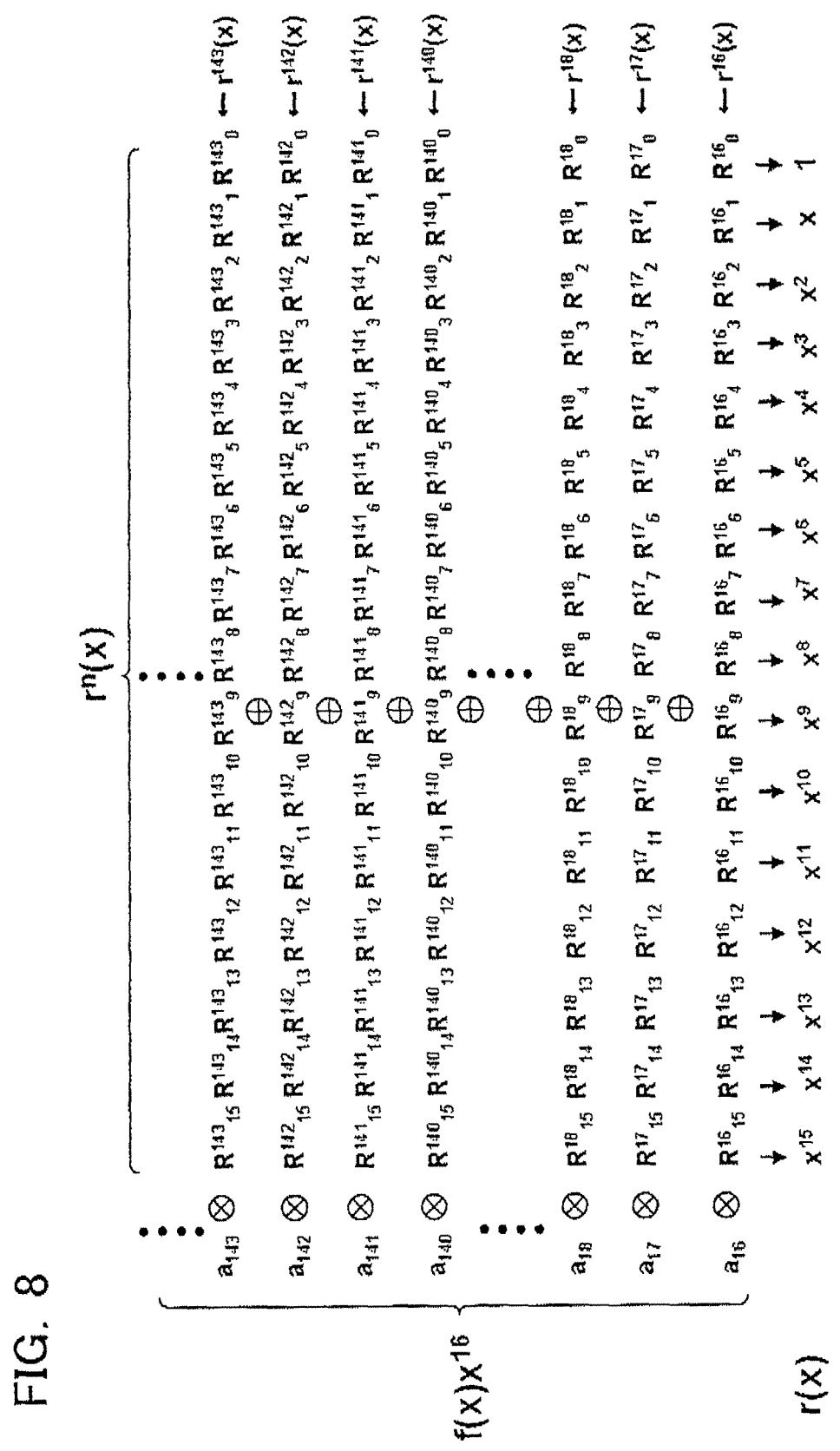

Actual calculation is as follows. For data bits $a_{16}$ to $a_{254}$, 111 bits out of them are selected in a way such that the syndrome calculation to be done later becomes less, and then fixed to "0". Next, as shown in FIG. 8, perform multiplication of the data polynomial's coefficient $a_i$ and the remainder polynomial's coefficient $R^i_m$ and addition (parity check) of those coefficients of terms of the same degree. More specifically, perform addition—i.e., parity check—of the coefficient $R^i_m$ of a remainder $r^i(x)$ of specific degree with the data bit $a_i$ being at "1" on GF(2) per each m; then, let the result be a check bit $b_m$.

An explanation will next be given of a calculation method during decoding as required when performing the selection of a "0"-fixed bit position(s) of 111 bits.

Firstly, the calculation of syndrome polynomial $S_1(x)$ is done, which is for obtaining a division remainder at $m_1(x)$ of polynomial $v(x)$ with data $d_i$, as read out of a memory cell being as its coefficient. This arithmetic operation is performed, as shown in FIG. 9, by multiplication of $d_i$ and the coefficient $P^i_m$ (m is 0, 1, . . . , 7) of remainder $p^i(x)$ that is obtained by dividing $x^i$ (i is 254, 253, . . . , 0) by $m_1(x)$, and addition (parity check) of its result. In other words, let a parity check result of m-th degree coefficient $P^i_m$ of $p^i(x)$ with $d_i$="1" be the m-degree coefficient of the syndrome polynomial $S_1(x)$.

In this calculation procedure, no calculations are done for portions of $d_i$="0" and when $P^i_m$ is "0", so that the selection of out-of-use bits determines the calculation amount in the case where all of 239 information bits are not used.

A calculation method relating to another syndrome polynomial $S_3(x)$ will next be described below.

In relation to the syndrome polynomial $S_3(x)$, what is needed for searching the error location j is the syndrome polynomial $S_3(x_3)$ Note that $S_3(x)$ per sc is a division remainder at $m_3(x)$ of $v(x)$. Between $v(x^3)$ and $S_3(x^3)$, a relationship shown in the following Expression 13 is establishable, where $P^i_m$ (m=0, 1, . . . , 7) is the coefficient of remainder polynomial $p^i(x)$ obtained by dividing $x^i$ by $m_1(x)$, and $d_i$ is the coefficient of $x^i$.

$$S_3(x) \equiv v(x) \bmod m_3(x),$$

$$m_3(x^3) \equiv 0 \bmod m_1(x),$$

$$S_3(x^3) \equiv v(x^3) \bmod m_3(x^3) \equiv v(x^3) \bmod m_1(x),$$

$$v(x) \equiv \Sigma d_i x^i,$$

$$v(x^3) \equiv \Sigma d_i x^{3i},$$

$$x^i \equiv p^i(x) \bmod m_1(x),$$

$$x^{3i} \equiv p^{3i}(x) \bmod m_1(x),$$

$$S_3(x^3) \equiv v(x^3) \bmod m_1(x) \equiv \Sigma d_i p^{3i}(x) \bmod m_1(x). \quad \text{[Exp. 13]}$$

From the above-described Expression 13, $S_3(x^3)$ is calculable by the coefficient $d_1$ of $v(x)$ and the remainder $p^{3i}(x)$. Thus, what is needed here is the coefficient $P^i_m$ of $p^i(x)$ at $m_1(x)$ of $x^i$, and its practical calculation method is as shown in FIG. 10.

In this calculation process also, no calculations are done for $d_i$="0" portions and when $P^{3i}_m$ is "0", so the selection of out-of-use bits determines the calculation quantity in case all of the 239 information bits are not used. As the decoding includes a process of performing computation for searching the error position(s) after completion of the syndrome polynomial calculation, the calculation amount is desirably minimized in order to shorten a time taken for such calculation. This is attainable by performing selection of 128 optimal terms (degrees) from the 238-degree information polynomial $f(x)$. This selection method will next be described below.

For the syndrome polynomials $S_1(x)$ and $S_3(x^3)$, calculations are performed simultaneously in a parallel, way. Calculation of each degree-term in each polynomial is the parity check of "1"; thus, the total calculation amount is expected to decrease if the coefficient of every degree is calculated without appreciable variations within almost the same length of time.

One preferred selection method therefor is arranged to include the steps of obtaining, for each "n", a total sum of the coefficients being at "1" of these syndrome calculation-used 7-degree remainder polynomials $p''(x)$ and $p^{3n}(x)$, and then selecting a specific number of n's corresponding to the required data bit number from the least side in number of the total sum. In this event, the first sixteen ones, i.e., the coefficients of $x^0$ to $x^{15}$, are used as the check bits to be fixed, and perform ascending-order selection of a total sum of "1"s of the coefficients to select 128 terms from the seventeenth one et seq.

Additionally, upon completion of the selection within a group of the same total-sum numbers, selection is done in order from the overlap of "1"s being less at the same degree terms as the reference while specifying n's as a reference with the coefficients "1"s being uniformly distributed between respective degree terms within $p''(x)$ and $p^{3n}(x)$. In other words, selection is done in order from the least side of the total sum of coefficients in the same terms as that of the reference with coefficients "1" of p″(x), p³″(x).

FIG. 11 shows 144 degrees "n" for use in the case of 144-bit data selected from 254 degrees in data polynomial f(x)x$^{16}$ as described above.

Although this selection method does not always minimize the greatest one of the number of the coefficients "1" of respective degrees of the polynomial for execution of parity checking, it is still a simple method capable of reducing a step number of syndrome calculation while at the same time reducing the scale of syndrome calculator circuitry without requiring large-scale calculation including search-up of a calculation step-minimized one from among all possible combinations.

Figure 12A:
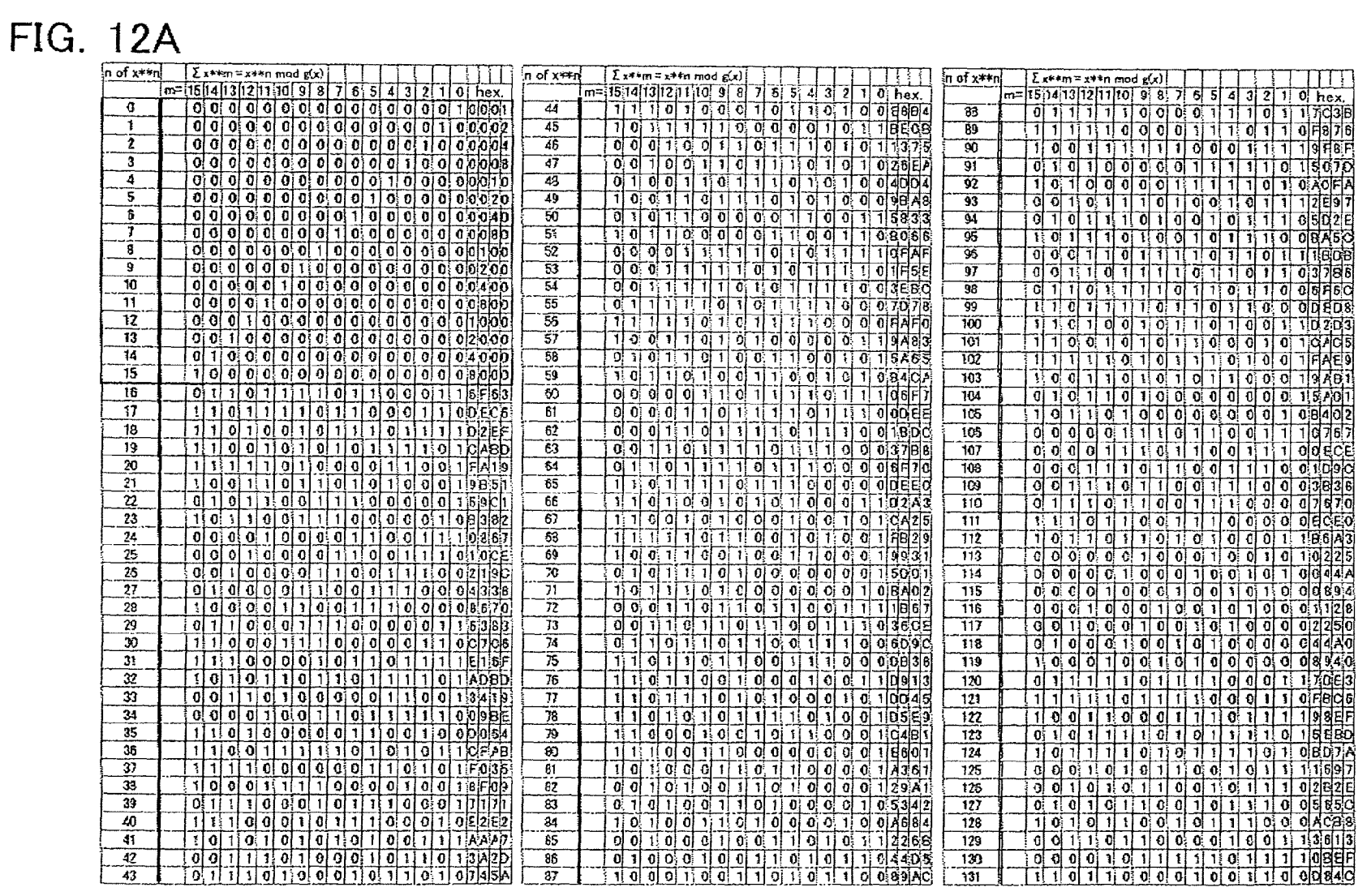
Figure 12B:
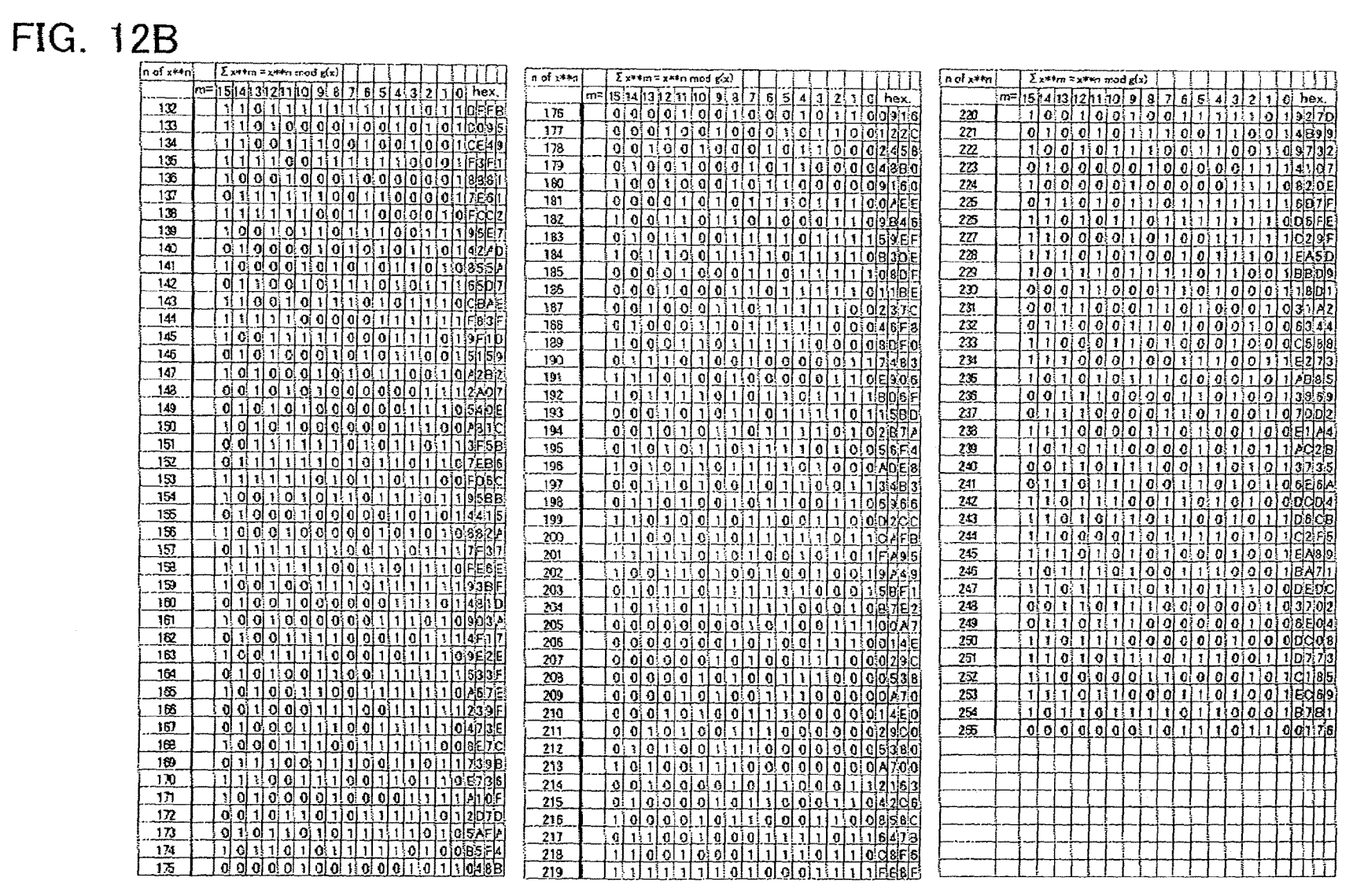

Upon execution of encoding using the degree number thus chosen to optimize the syndrome calculation, the coefficient of the remainder polynomial r″(x) of a corresponding degree becomes necessary, so this is shown in FIGS. 12A and 12B.

Shown in FIGS. 12A-12B are 15-degree remainder polynomials coefficients as obtained by division of the respective terms of data polynomial f(x)x$^{16}$ by code generation polynomial g(x), Those of from x$^0$ to x$^{15}$ are absent in the information data polynomial, so these are actually out of use. Also shown here are hexadecimal indications of coefficients of degrees 0 to 3, 4 to 7, 8 to 11, and 12 to 15.

Figure 13:
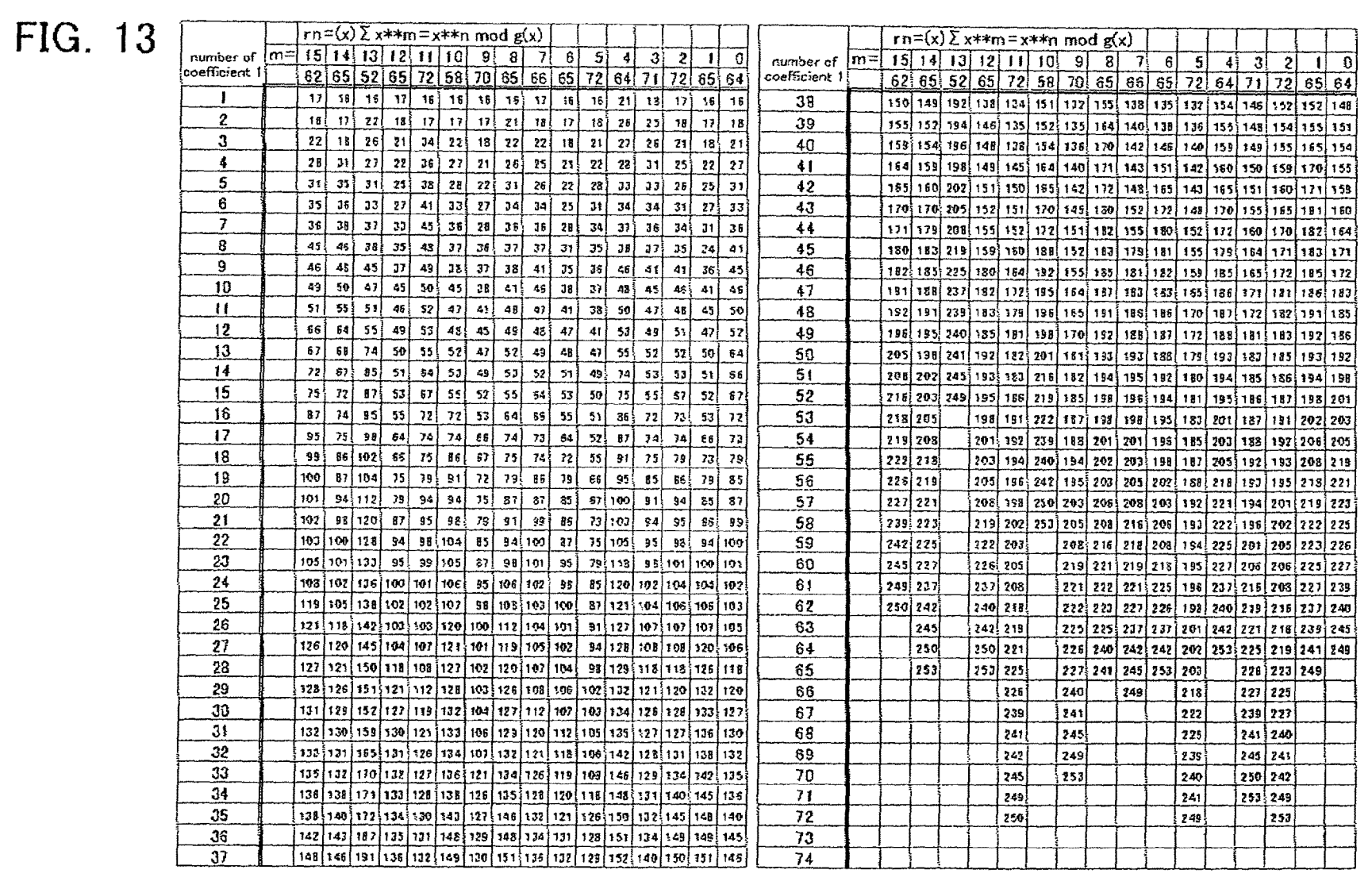

FIG. 13 shows, in table form, respective coefficients concerning the ones corresponding to 128 x$^n$'s for use ax data bits, which are selected from the coefficient table of these remainder polynomials r″(x). That is, FIG. 13 is a table of degree number "n", at which the coefficient of the remainder r″(x) for selected x$^n$ is "1".

For example, the degree number "n" of r″(x) with the coefficient of x$^{15}$ being "1" is 17, 18, 22, . . . , 245, 249 and 250 written in fields defined by the number of coefficient "1" being from 1 to 62, in the column of m=15. Note that b$_{15}$ which is equivalent to the coefficient of a check bit x$^{15}$ is obtainable as a result of parity check of this selected n-degree terms' coefficients in the information data polynomial f(x) x$^{16}$.

Figure 14:
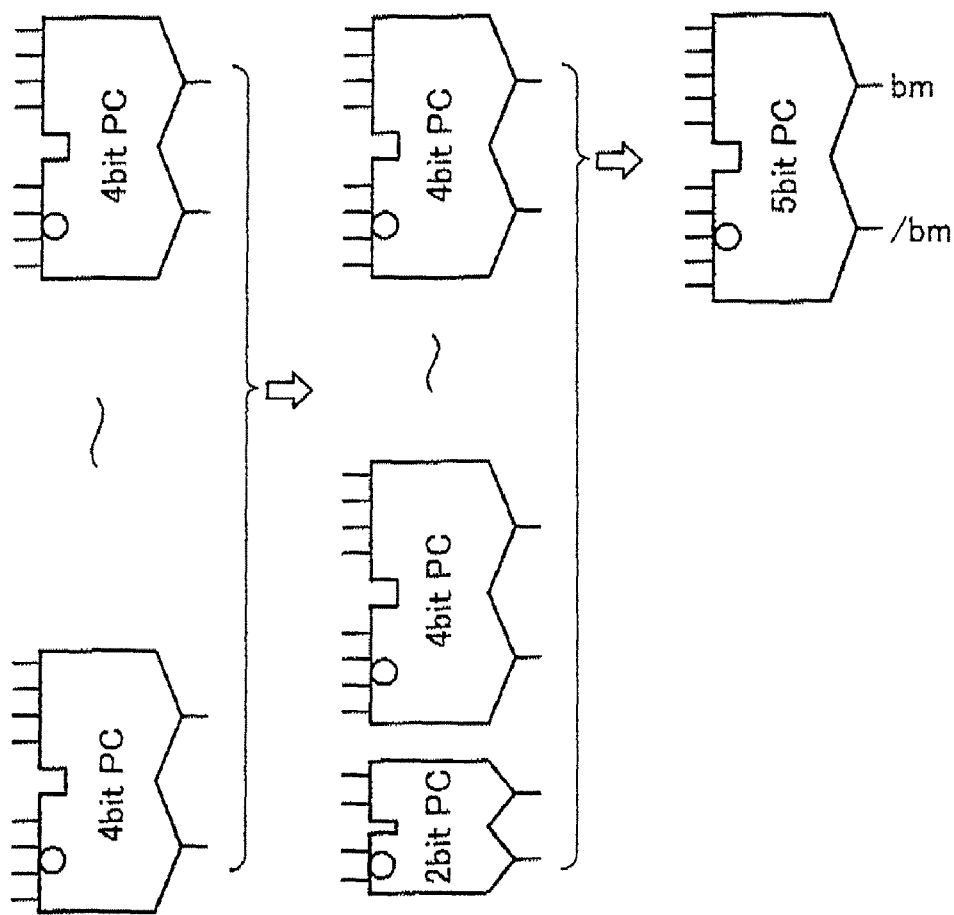
FIG. 14 is a diagram showing a configuration of a parity check circuit for use in test bit calculation.

FIG. 14 shows an exemplary circuit, which performs check bit calculation based on the table. It is apparent from the table of FIG. 13 that for m=11, 5, 2 of x$^m$, there are a maximum of 72 bit numbers to be subjected to parity check. So, this case is shown as an example in FIG. 14. Since there are indicated in the table such the degree numbers "n" that the coefficient P″$_m$ of m-degree term of remainder polynomial r″(x) is not "0", select "n" from the table for each "m", and then execute parity check using a$_n$ and /a$_n$.

An appropriate combination of parity check (PC) circuits to be used is determined depending on the number of inputs belonging to which one of the division remainder systems of four (4). More specifically, if it is dividable by 4, 4-bit PC is solely used. If such division results in presence of a remainder of 1, 5-bit PC is added. If the remainder is 2, 2-bit PC is added. If 3 remains then 3-bit PC is added.

In the example of m=11, 5 and 2, there are 72 inputs. A check bit calculator circuit adaptable for use in this case is configurable from three stages of parity check (PC) circuits as shown in FIG. 14. A primary stage consists of eighteen 4-bit PCs. The second stage is of 18 inputs, so let it be arranged by four 4-bit PCs and one 2-bit PC. The third stage becomes 5 inputs, so this is made up of a one 5 bit PC. An output of the third-stage parity check circuit becomes a check bit b$_m$, /b$_m$.

Similar calculation to that in the case of check bit calculation will be performed in the syndrome calculation, in a way set forth below.

FIG. 15 is a table of the number of degrees whose coefficient is "1" in 7-degree remainder polynomial p″(x) for use in the calculation of the syndrome polynomial S$_1$(x). For example, the degree number n of p″(x) with the coefficient of x$^7$ being "1" is 7, 11, 12, . . . , 237, 242, 245 written in fields defined by the number of coefficient "1" being from 1 to 56, in the column of m=7. The coefficient of x$^7$ of S$_1$(x) is obtained as a result of parity check of the coefficient of this selected n-degree term in the data polynomial v(x)

Figure 16:
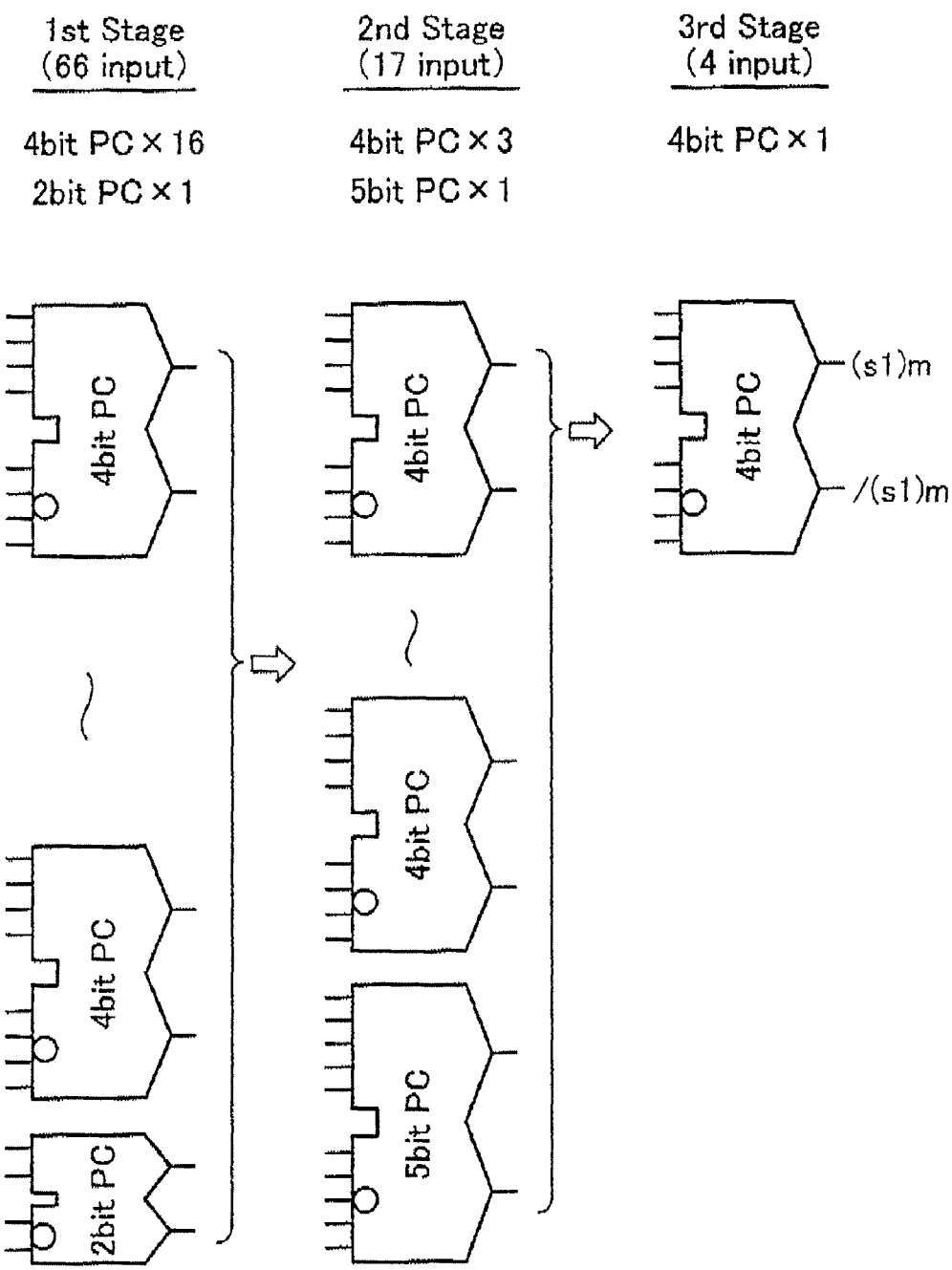
FIG. 16 shows an exemplary circuit for calculation of the syndrome polynomial $S_1(x)$.

An example of electrical circuitry for performing calculation of the syndrome S$_1$(x) based on the table of FIG. 15 is shown in FIG. 16. It is apparent from FIG. 15 that in the case of m=6, 2, the number of bits to be parity-checked is 66 in maximum. This case is shown as an example in FIG. 16. As those degree numbers n with the coefficient P″$_m$ of m-degree term of remainder polynomial p″(x) not being at "0" are listed in the table, select n from this table about each m and then execute parity check using data bits d$_n$ and /d$_n$.

A proper combination of parity checkers (PCs) used is determined depending on the number of inputs belonging to which one of the division remainder systems of 4. More precisely, if it is just dividable by 4, then 4-bit PC is solely used; if the division results in presence of a remainder 1, 5-bit PC is added; if the remainder is 2, 2-bit PC is added; and, if 3 remains then 3-bit PC is added.

In the example of m=6, 2, there are 66 inputs. So in this case also, three stages of parity check (PC) circuits are used to configure the intended calculator circuitry. The first stage is made up of sixteen 4-bit PCs and one 2-bit PC. The second stage is of 17 inputs, so it is constituted from three 4-bit PCs and a 5-bit PC. The third stage is of 4 inputs and thus is arranged by only one 4-bit PC. An output of the third stage becomes a coefficient (s1)$_m$.

The same goes with the calculation of the syndrome polynomial S$_3$(x$^3$), and this will be discussed below.

FIG. 17 is a table of the number of degrees whose coefficient is "1" in the remainder p$^{3n}$(x) for use in the calculation of syndrome polynomial S$_3$(x$^3$).

For example, the degree number n of p$^{3n}$(x) with the coefficient of x$^7$ being "1" is 4, 8, 14, . . . , 241, 242 and 249 written in fields from 1 to 58 in the column of m=7. A data (s3)$_7$ that corresponds to the coefficient of x$^7$ of S$_3$(x$^3$) is obtainable as a result of parity check of the coefficient of this selected n-degree term in the data polynomial v(x).

Figure 18:
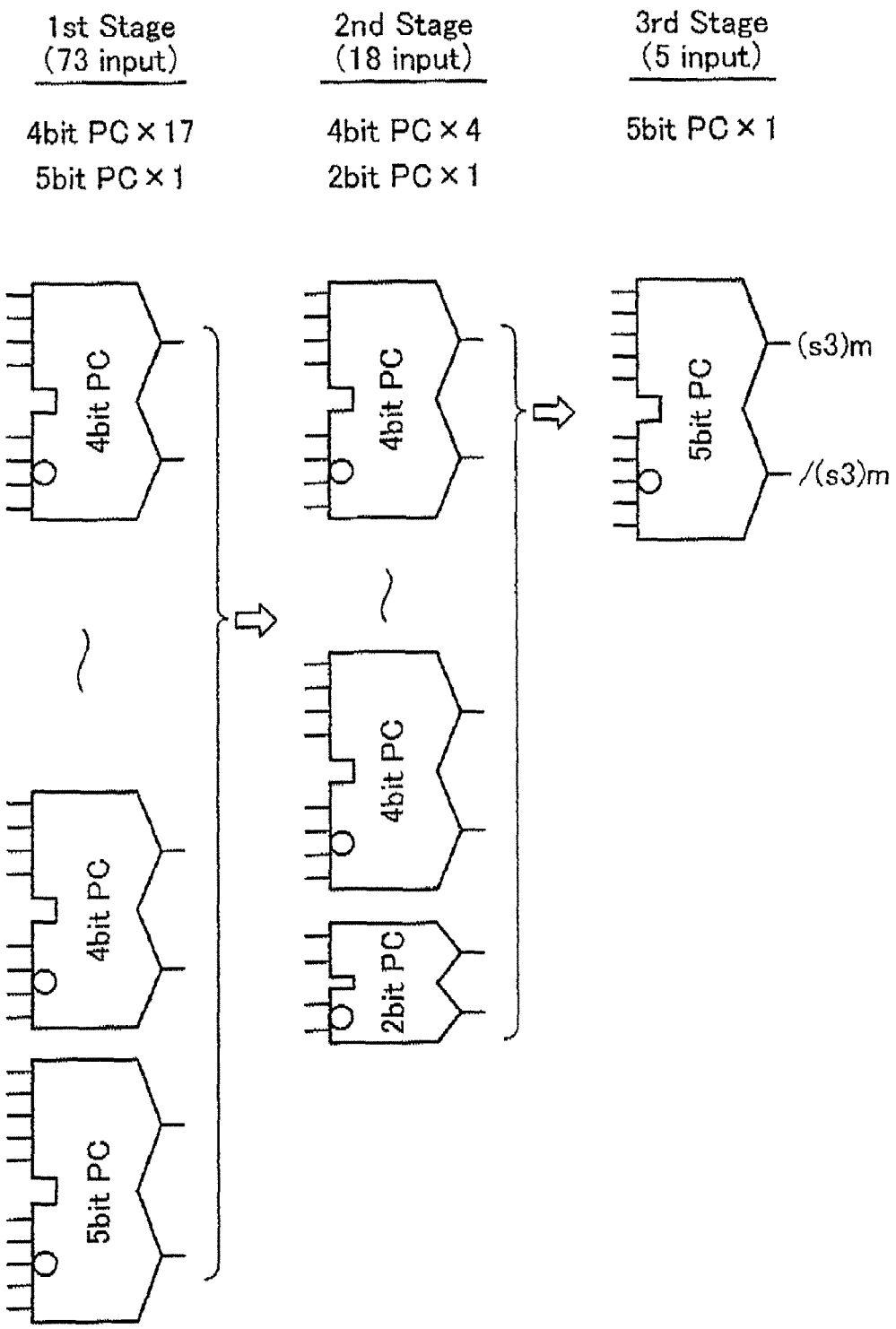
FIG. 18 shows an exemplary circuit for calculation of the syndrome polynomial $S_3(x^3)$.

An exemplary calculation circuit therefor is shown in FIG. 18. As the FIG. 17 table suggests that the number of bits to be parity-checked for m=5 of x$^m$ is 73 in maximum, this case is shown in FIG. 18 as an example. Since those degree numbers n with the coefficient P$^{3n}_m$ of m-degree term of remainder polynomial, p$^{3n}$(x) not being at "0" are shown in the table, select n from the table for each m and then execute parity check using d$_n$ and /d$_n$.

An appropriate combination of parity checkers (PCs) used is determinable depending on the number of inputs belonging to which one of the 4-division remainder systems. More specifically, if dividable by 4, use 4-bit PC only. If the division results in presence of a remainder 1, add 5-bit PC. If the remainder is 2, add 2-bit PC. If 3 remains then add 3-bit PC.

In the example of m=5, there are 73 inputs. Therefore, in this case also, three stages of parity check circuits are used to configure the calculation circuitry. The first stage is made up of seventeen 4-bit PCs and a 5-bit PC. As the second stage is of eighteen inputs, it is formed of four 4-bit PCs and a 2-bit PC. The third stage may be configured from only one 5-bit PC as it becomes five inputs. An output of the third stage becomes the coefficient (3s)$_m$, /(s3)$_m$.

Figure 19:
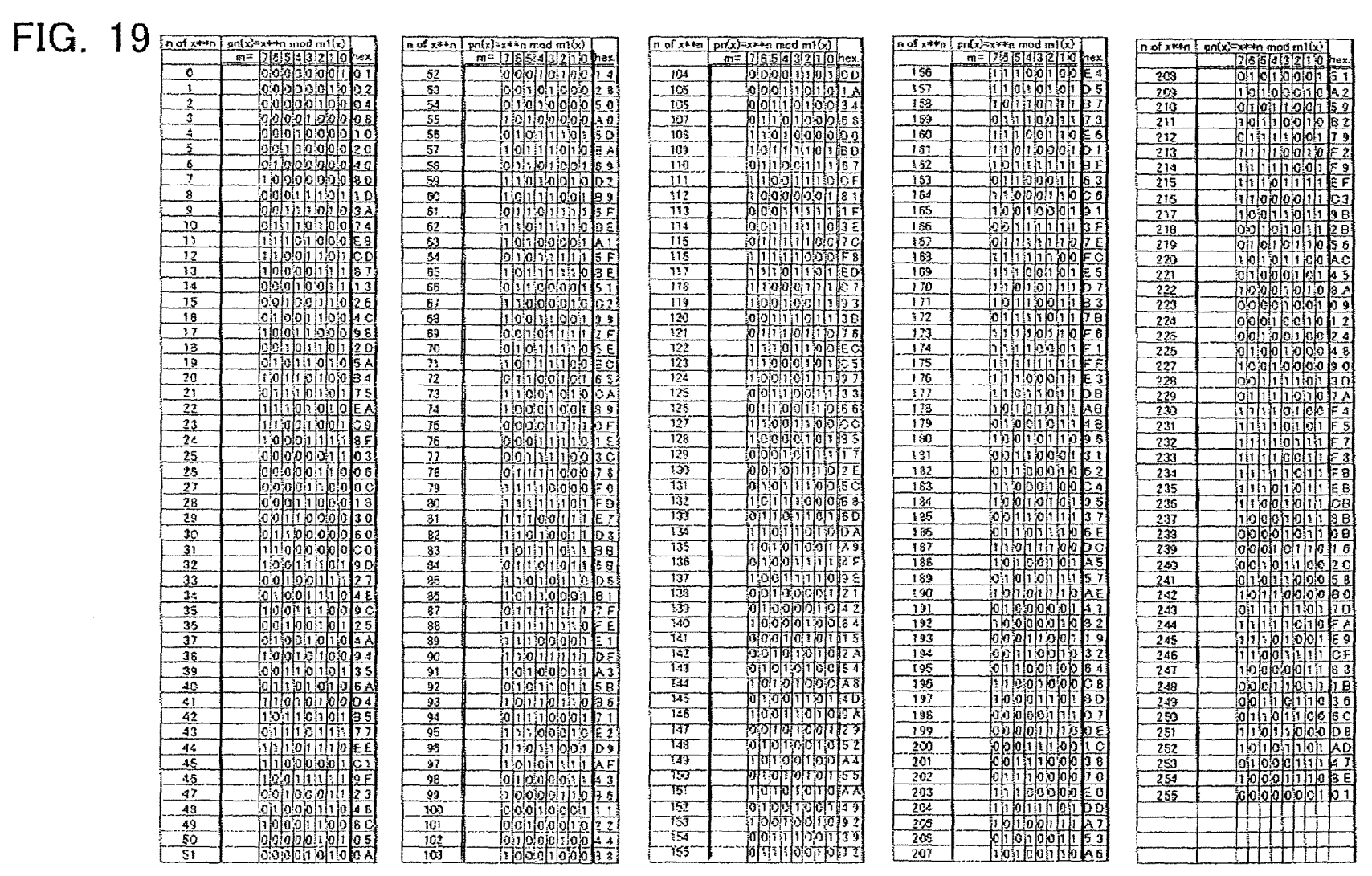

Next, coefficients of remainder polynomial p″(x) required for decoding are shown in FIG. 19. There are shown here the coefficient "0", "1" at each degree number n of p″(x) that is a division remainder of $x^n$ by $m_1(x)$, and hexadecimal indications thereof of degrees 0 to 3 and 4 to 7. Using this table, select the degree n of 128+16 for use as data bits in the way stated supra.

An explanation will next be given of a circuit system which searches an error location(s).

Error location search is to find out p″(x) that satisfies the following Expression 14, which is a little modified version of the polynomial $\Lambda^R(x)$ in Expression 10.

$$\Lambda^R(p^n) = (p^n)^2 + (p^n)S_1(x) + (S_1(x))^2 + S_3(x^3)/S_1(x) \quad [\text{Exp. 14}]$$
$$\equiv 0 \bmod m_1(x)$$

In other words, the error position searching calculation system is aimed at find-out of n with the coefficient of a polynomial (p″) $S_1(x)+(S_1(x))^2+S_3(x^3)/S_1(x)$ and the coefficient of $p^{2n}$ becoming equal to each other by execution of comparison therebetween.

Figure 20:
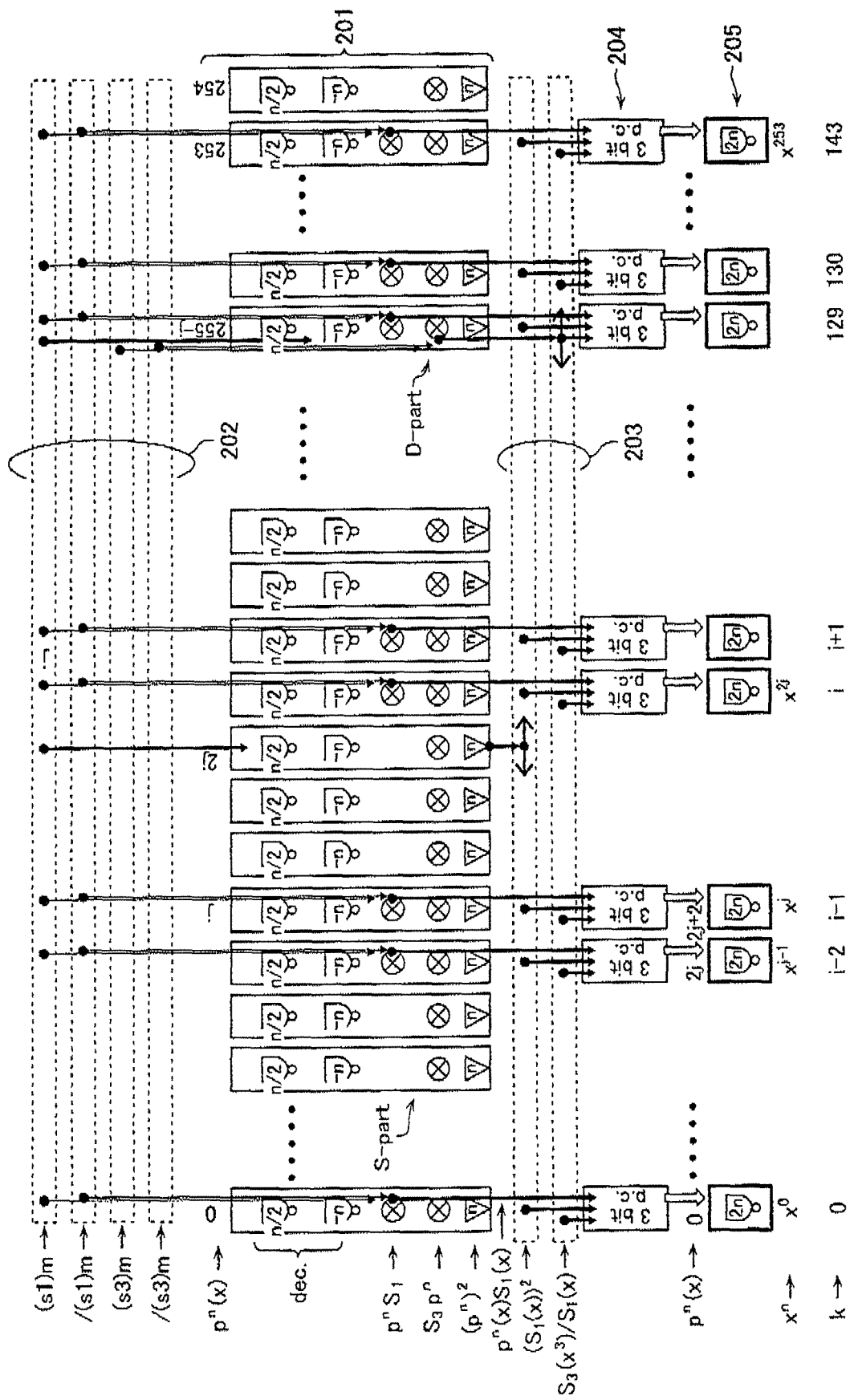
FIG. 20 is a diagram showing an error location searching circuit in ECC circuitry.

FIG. 20 shows a circuit configuration of such error location search calculation system, which has 255 arithmetic operation units 201 corresponding to the respective polynomials p″(x) (n=0, 1, 2, . . . , 254). Comparing calculation results of these arithmetic operation units 201 with the coefficient of $(p''(x))^2 = p^{2n}(x)$ to find the location where the degree numbers n are matched, this location is the position of an error data bit.

The 255 arithmetic operation units 201 are divided into two types of units, i.e., "D-part" units and "S-part" units. D-part is a first arithmetic operation module prepared for 144 bits selected for actual use as data bits (corresponding to the second, third and fourth terms on the right side of Expression 14) while S-part is a second arithmetic operation module with exclusive relevancy to syndrome polynomials (corresponding to the third and fourth terms on the right side of Expression 14).

Syndrome polynomial coefficient data $(s1)_m$,$/(s1)_m$, $(s3)_m$, $/(s3)_m$ are output onto data buses 202 and then input to the arithmetic operation units 201. These units 201 have decoder units "dec." for selecting appropriate arithmetic operation units of accordance with the syndrome polynomial coefficient of interest, which are disposed in common to the first and second arithmetic operation units D-part and S-part. The decoder units "dec." have, with respect to the position of each p″(x), (n/2) decoders selected by the coefficient of $S_1(x)$ equivalent to that of $p^{2n}(x)$ and (−n) decoders selected by the coefficient of $S_1(x)$ equivalent to the coefficient of $p^{255-n}(x)$.

The arithmetic operation circuitry 201 also includes a unit for generating the coefficient of $(p''(x))^2 = p^{2n}(x)$ selected by the (n/2) decoder and a parity check unit for generating the coefficient of a polynomial obtained by multiplication of p″(x) and syndrome polynomial $S_3(x^3)$ selected by the (−n) decoder. These units are decoder-selected to output $(S_1(x))^2$ and $S_3(x^3)/S_1(x)$ to a common data bus 203 disposed for D- and S-parts.

The first arithmetic operation unit D-part further includes a parity check unit for generating the coefficient of a polynomial of a product of p″(x) and $S_1(x)$. This parity checker permits simultaneous computation at every portion of the first arithmetic operation unit D-part. To perform parity checking of this parity-check computation result in D-part and $(S_1(x))^2$ and $S_3(x^3)/S_1(x)$ on the common data bus 203 shared by S- and D-parts, there are prepared parity checkers 204.

Computation results of these parity checkers 204 are used to select one among (2n) decoders 205, which performs decoding equivalent to the coefficient of $p^{2n}(x)$ at the position of p″(x). The selected polynomial p″(x) is a selected term $x_n$ corresponding to the position of an error bit. Thus it is possible to specify an error(s) in a k-to-n correspondence manner, where k is a 144-bit data position.

Figure 21:
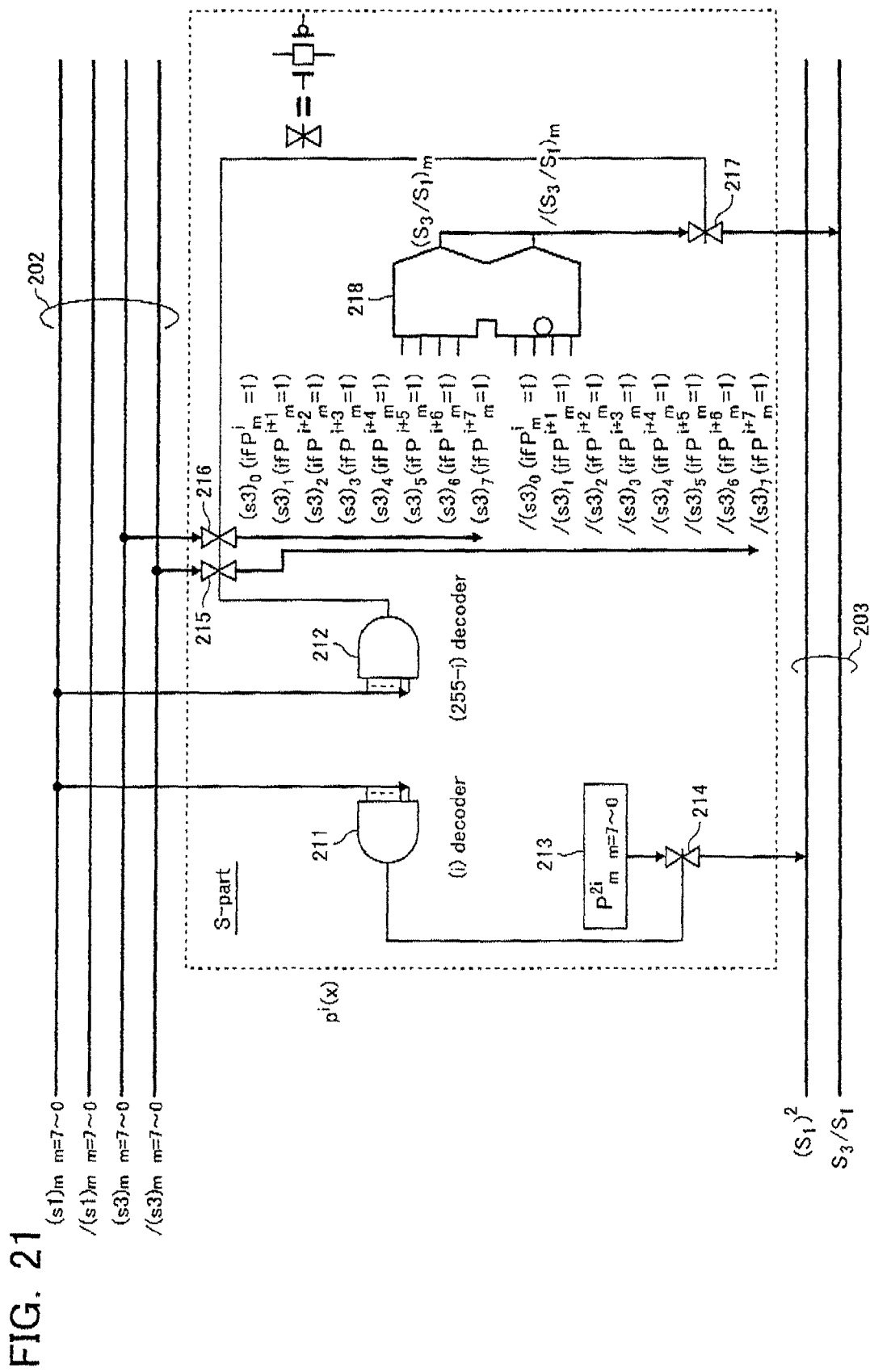
FIG. 21 is a diagram showing a configuration of a module called "S-part" in the error location search circuit.

FIG. 21 shows, with respect to the position of $p^i(x)$, a detailed configuration of a calculation circuit of the second arithmetic operation unit "S-part", which is exclusively related to the syndrome polynomials $(S_1(x))^2$, $S_3(x^3)/S_1(x)$. It has decoders for decoding the coefficient of $S_1(x)$ to select this second arithmetic operation unit S-part, including a decoder 211—namely, (i) decoder—to be selected when its coefficient is the same as the coefficient of $p^i(x)$ and a decoder 212, i.e., (255-i)decoder, to be selected when its coefficient is identical to the coefficient of $p^{255-i}(x)$.

The output of decoder 211 is coupled to an output switch 214 of a latch circuit 213 for generation of the coefficient $P^{2i}_m$ (m=0, 1, 2, . . . , 7) of $p^{2i}(x)$. In case this second arithmetic operation unit S-part is selected, its coefficient is output to one of the buses 203 on the $(S_1)^2$ side. The output of decoder 212 is coupled to switches 215 and 216 for acceptance of the coefficient of $S_3(x^3)$ and a switch 217 which outputs an output of a parity check circuit 218 that performs parity checking of these coefficients toward the other of the buses 203 on the $S_3/S_1$ side.

The parity check circuit 218 is for multiplying a coefficient $(s3)_k$ and coefficient $P^{i+k}_m$ to obtain a sum of k=0, 1, 2, . . . , 7. More specifically, it performs parity check of coefficients $(s3/s1)_k$ with $P^{i+k}_m = "1"$ so that its result becomes a coefficient $(s3/s1)_m$ (m=0, 1, . . . , 7). This parity check result is output to the $S_3/S_1$ side one of the buses 203 when the switches 215-217 turn on.

The parity check circuit 218 is configurable by combination of various types of circuits as in the previously stated calculation circuit example; for instance, it is arranged to have two stages in maximum.

Figure 22:
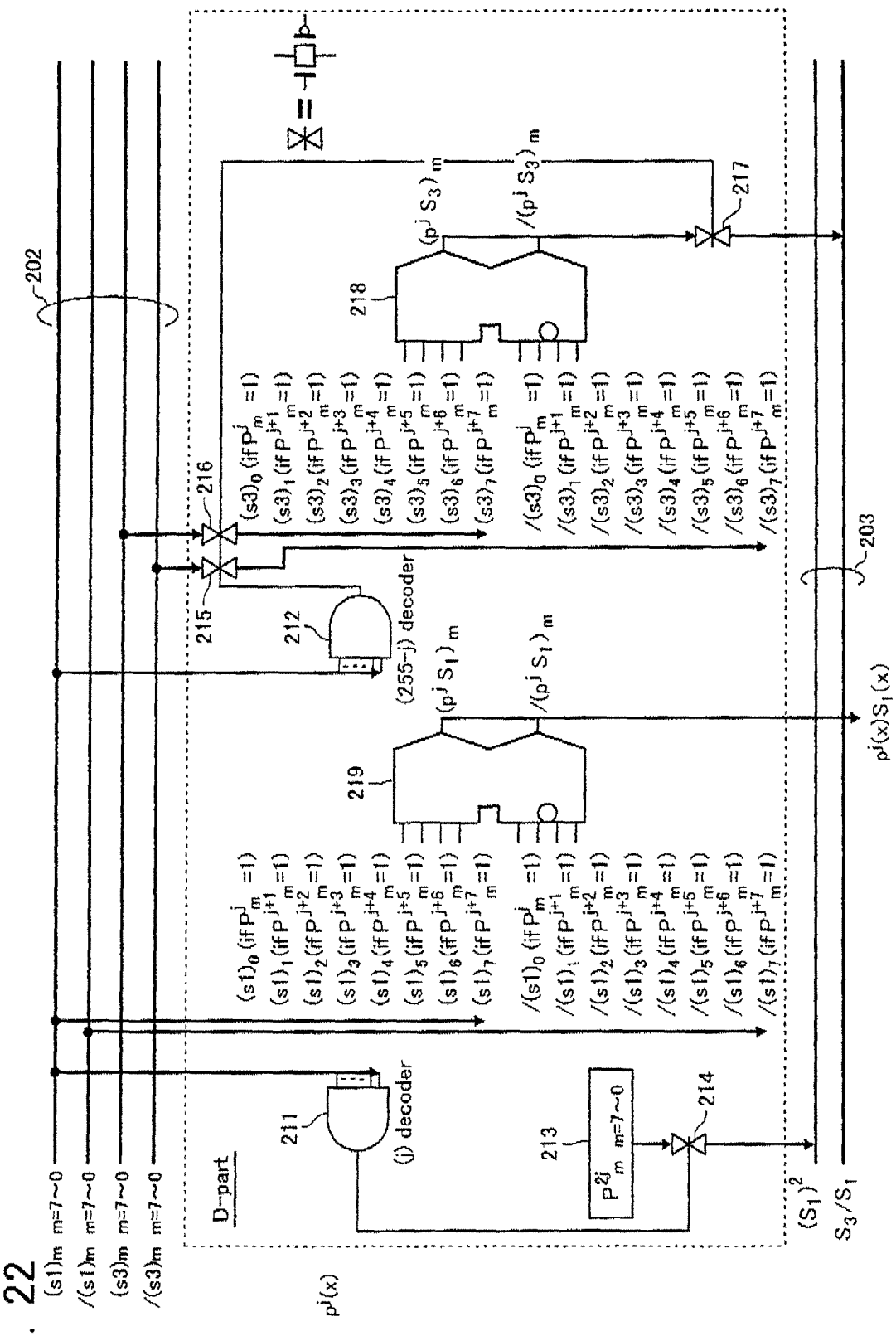
FIG. 22 is a diagram showing a configuration of "D-part" unit in the error location search circuit.

FIG. 22 shows, for the position of $p^j(x)$, a detailed configuration of the first arithmetic operation unit D-part. Here, in addition to the calculation relating only to the syndrome polynomial in the same way as the second arithmetic operation unit S-part, the first arithmetic operation unit D-part is designed to perform calculation unique thereto. Its decoders 211-212, latch 213, switches 215-217 and parity checker 218 are the same in principle as those of the second arithmetic operation unit S-part shown in FIG. 21.

The computation unique to the second arithmetic operation unit S-part lies in the part of a parity check circuit 219, which accepts coefficients of $S_1(x)$ to perform parity checking of these coefficients. This parity checker 219 functions to multiply coefficients $(s1)_k$ and $P^{j+k}_m$ to obtain a sum of k=0, 1, 2, . . . , 7. In other words, parity check of $(s1)_k$ with $p^{j+k}_m$ being at "1" is performed, and its result becomes the coefficient $(p^jS_1)_m$ (m=0, 1, 2, . . . , 7) of $p^j(x)S_1(x)$. This parity checker 219 also is configurable to have two stages in maximum by combination of various types of circuits as in the previously stated calculation circuit example.

Figure 23:
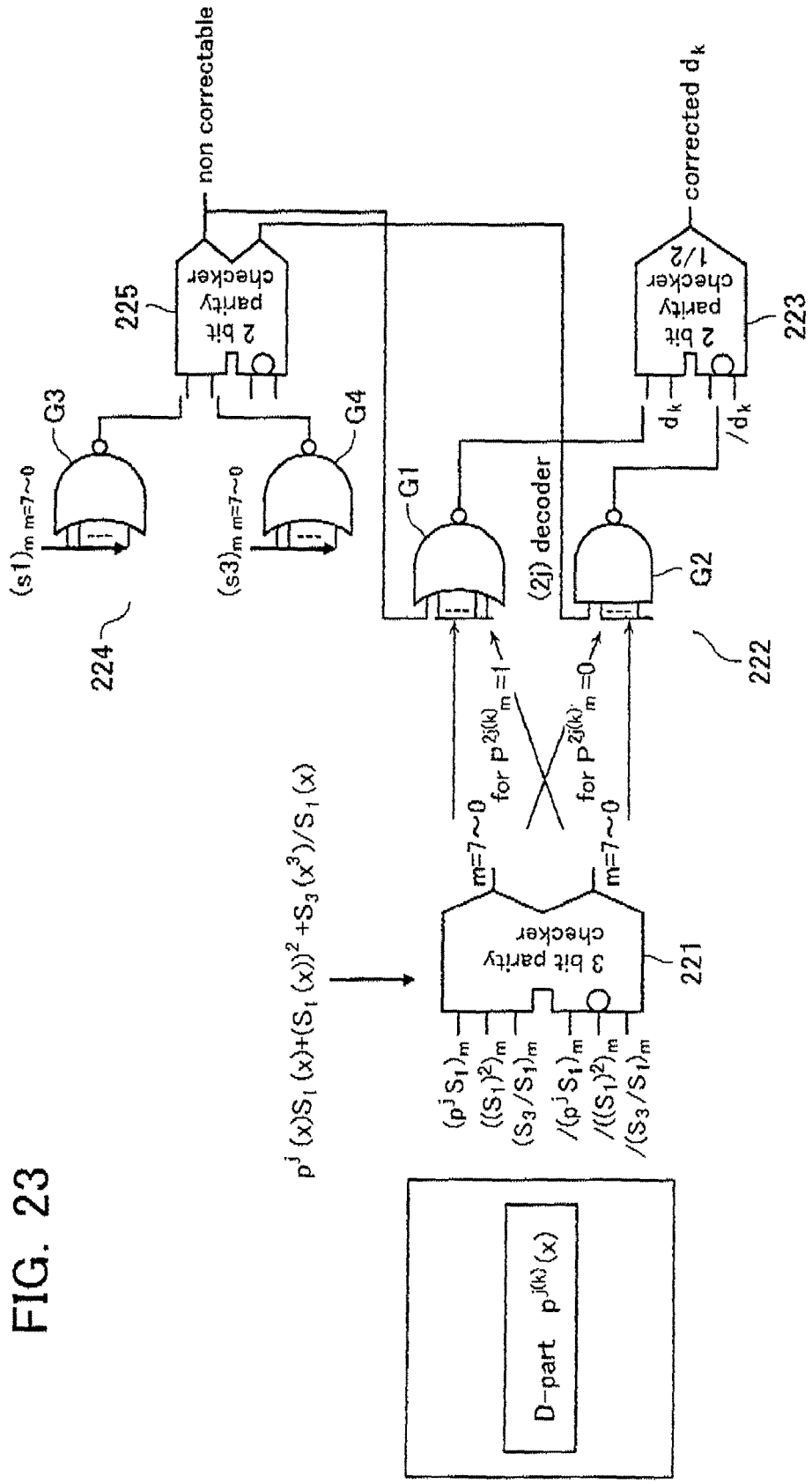
FIG. 23 is a diagram showing a configuration of an error correction circuit operatively associated with the error location search circuit.

FIG. 23 depicts a configuration of an error correction circuit for performing error correction through computation of outputs of the above-stated first and second arithmetic operation units D-part and S-part. Here, it calculates a polynomial p″(x) $S_1(x)+(S_1(x))^2S_3(x^3)/S_1(x)$ based on each elemental circuit of first arithmetic operation unit D-part; then, compare its calculation result with $p^{2n}(x)$, thereby performing data error correction. More precisely, FIG. 23 shows circuitry relating to $p^{j(k)}(x)$ that is a portion of first arithmetic operation unit D-part corresponding to the actual bit position k of the data.

The polynomial coefficient calculation of $p^j(x)S_1(x)+(S_1(x))^2 S_3(x^3)+/S_1(x)$ is performed at a parity check circuit 221. This parity checker is arranged to perform 3-bit parity checking of coefficient $(p^j S_1)_m$ output from first arithmetic circuit D-part, coefficient $((S_1)^2)_m$ on common bus 203 and coefficient $(S_3/S_1)_m$ on common bus 203, for each m (m=0, 1, . . . , 7).

The calculation result obtained is input to a decoder 222 ((2j)decoder), which is selected when it is matched with the coefficient of $p^{2j(k)}$. This decoder 222 is formed of a pair of NOR circuit G1 and NAND circuit G2, which generate mutually complementary outputs. More specifically, when the decoding results in "coincidence" of coefficients, NOR circuit G1 generates "1" at its output while NAND circuit G2 outputs "0". If not coincidence, the former outputs "0"; and the latter "1".

Figure 24:
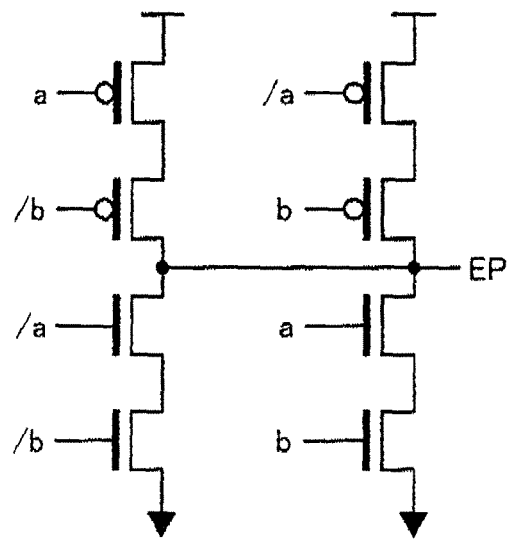
FIG. 24 is a diagram showing a 2-bit parity check circuit for used in the error correction circuit.

The output of this decoder 222 is input to a 2-bit parity check circuit (data inverter circuit) 223. This circuit is an Exclusive-OR (XOR) circuit, to which data bit $d_k$ and the decoder output are input. As shown in FIG. 24, this 2-bit parity checker 223 outputs EP="0" when 2-bit inputs are identical to each other. Accordingly, when the decoder 222 issues an coincidence signal, an inverted version of the data bit $d_k$ is output; if these fail to be matched together, the data bit $d_k$ is output as it is.

If there are errors of 3 bits or more, error correction is impossible. To judge this, a determination circuit 224 is provided. The rule utilized here is that if only either one of the syndrome polynomials $S_1(x)$ and $S_3(x^3)$ is 0 in mod $m_1(x)$, three bits or more of errors must be present. More precisely, NOR circuits G3 and G4 are used for detecting $(s1)_m=0$ and $(s3)_m=0$, respectively, within the range of from m=0 to m=7. The determination results thereof are calculated at a 2-bit parity check circuit 225.

If the parity check result is "1", this indicates "non correctable" (i.e., the lack of error correctability). The "1" output of this parity checker 225 is for use as a control signal, which makes the decoder 222 inactive to eliminate execution of data correction.

So far, there is discussed such the 2EC-BCH code that which is adapted to 1-bit or 2-bit error correction. However, more generally, it is possible to use a t-bit error-correctable BCH code, where $t \geq 2$. In this case, the BCH code is formed to have t roots of $\alpha, \alpha^3, \ldots, \alpha^{2t-1}$ in Galois field $GF(2^m)$.

Figure 25:
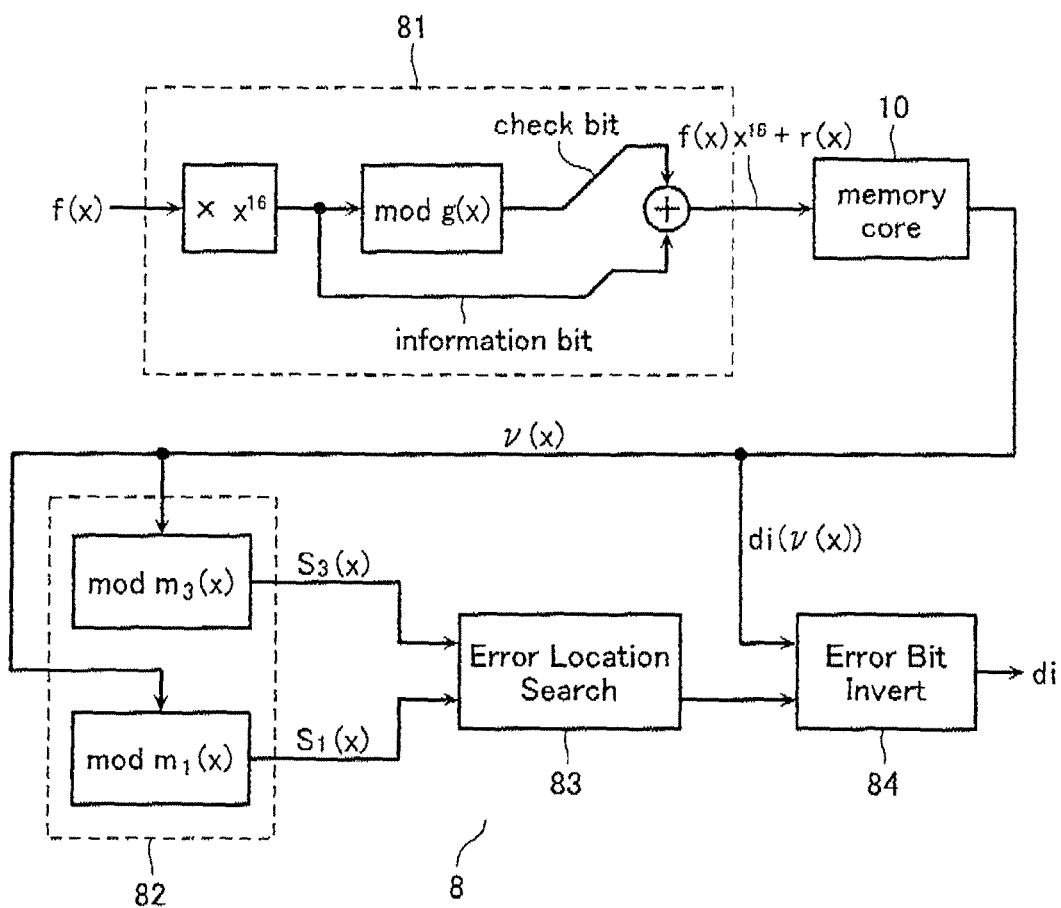
FIG. 25 shows a functional block configuration of the ECC system in accordance with the embodiment.

FIG. 25 shows a functional block configuration of ECC system 8 in the embodiment described above. In encoding part 81, data polynomial $f(x)x^{16}$ based on the information polynomial $f(x)$ is divided by code generation polynomial $g(x)=m_1(x)m_3(x)$ to generate check bits, which are written into the memory core 10 together with to-be-written data. In this embodiment where 2EC-BCH code is used, the information polynomial f(x) is 238-degree one. As described above, 128 bits are selected as a unit of to-be-written data in the coefficients of the information polynomial, and 16 check bits are generated here.

Read out data from the memory core 10 are input to syndrome operation part 82 to be subjected to syndrome operations. In detail, in this embodiment, in which two-bit error detecting and correcting is performed, the syndrome operation part 82 operates the read out data to obtain two syndrome polynomials $S_1(x)$ and $S_3(x)$.

It is error location searching part 83 to search error location(s) based on the obtained syndrome coefficients. Error correction part 84 inverts data bit at a detected error location and output it. The detailed example explained with reference to FIGS. 21 to 23 corresponds to the error location searching part 83 while that explained with reference to FIG. 24 corresponds to the error correcting part 84.

This invention is applicable to any types of electrically erasable programmable semiconductor memory devices other than the flash memory as discussed in the above-noted embodiment.

Figure 26:
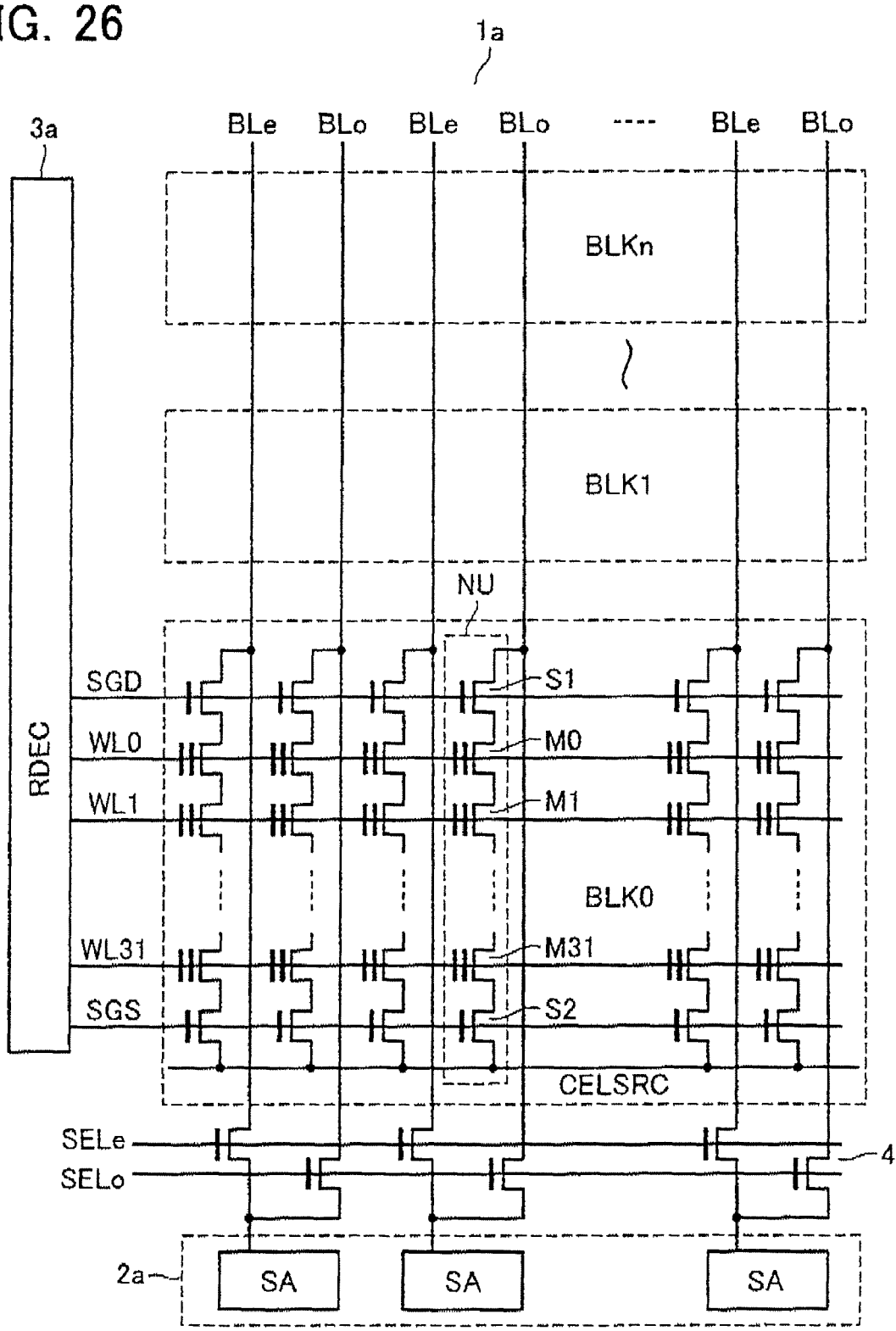
FIG. 26 is a diagram showing a configuration of core circuitry in a NAND flash memory device incorporating the principles of this invention.

FIG. 26 shows a configuration of one typical memory core circuit in a standard NAND flash memory, to which this invention is adaptable. This memory core circuit includes cell array 1a, sense amplifier circuit 2a and row decoder 3a. Cell array 1a is configured from parallel combination of NAND cell units (NAND strings) each having a serial connection of memory cells M0 to M31. NAND cell unit NU has one end connected to an associated bit line BLe (BLo) through a select gate transistor S1 and the other end coupled a common source line CELSRC via another select gate transistor 32.

The memory cells have control gates, which are connected to word lines WL0-WL31. The select gate transistors S1-S2 have their gates coupled to select gate lines SGD and SGS, respectively Word lines WL0-WL31 and select-gate lines SGD-SGS are driven by the row decoder 3a.

The sense amp circuit, 2a has one page of sense units SA for performing "all-at-a-time" writing and reading. Each sense unit SA is associated with a bit line selector circuit 4, which selects either one of adjacent bit lines BLe-BLo for connection thereto. With such an arrangement, memory cells simultaneously selected by a single word line WLi and a plurality of even-numbered bit lines BLe (or odd-numbered bitlines BLo) constitute a page (one sector), which is subjected to a collective writing/reading. Bit lines on the non-select side are used as shield lines with a prespecified potential being given thereto. This makes possible to suppress unwanted interference between the presently selected bit lines.

A group of NAND cell units sharing the word lines WL0-WL31 makes up a block, i.e., a unit for data erasure. As shown in FIG. 26, a predetermined number, n, of blocks BK0-BLKn are laid out in the extending direction of the bit lines.

In the NAND flash memory with the core circuit also, the need grows for on-chip realization of correction of 2 bits or more errors with advances in the miniaturization and in per-cell multi-level storage scheme. The error correction system incorporating the principles of this invention is capable of reducing or minimizing the calculation scale for error detection and correction, thereby enabling successful achievement of computation at high speeds. Thus it can be said that the ECC architecture unique to the invention offers advantages upon application to memory chips of the type stated supra.

[Application Devices]

As an embodiment, an electric card using the non-volatile semiconductor memory devices according to the above-described embodiments 1-3 of the present invention and an electric device using the card will, be described bellow.

Figure 27:
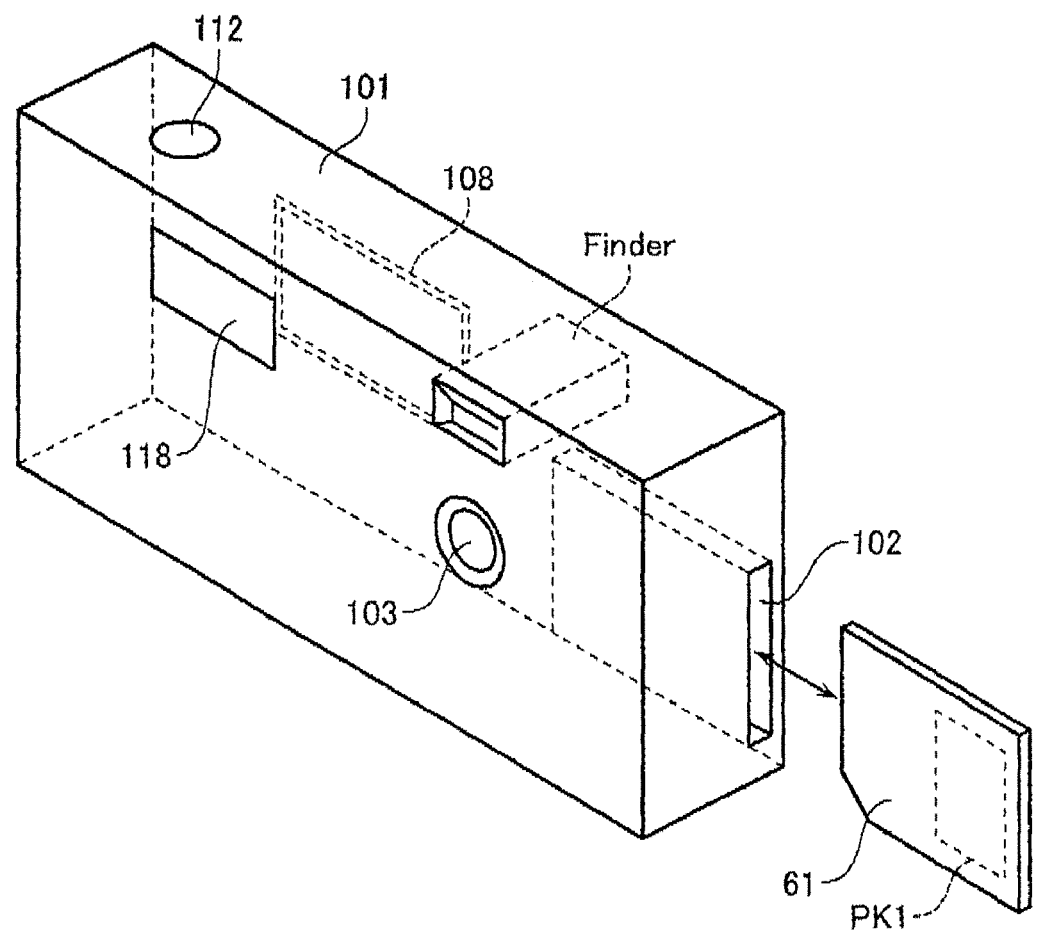
FIG. 27 shows another embodiment applied to a digital still camera.

FIG. 27 shows an electric card according to this embodiment and an arrangement of an electric device using this card. This electric device is a digital still camera 101 as an example of portable electric devices. The electric card is a memory card 61 used as a recording medium of the digital, still camera 101. The memory card 61 incorporates an IC package PK1 in which the non-volatile semiconductor memory device or the memory system according to the above-described embodiments is integrated or encapsulated.

The case of the digital still camera 101 accommodates a card slot 102 and a circuit board (not shown) connected to this card slot 102. The memory card 61 is detachably inserted in the card slot 102 of the digital still camera 101. When inserted in the slot 102, the memory card 61 is electrically connected to electric circuits of the circuit board.

If this electric card is a non-contact type IC card, it is electrically connected to the electric circuits on the circuit board by radio signals when inserted in or approached to the card slot 102.

Figure 28:
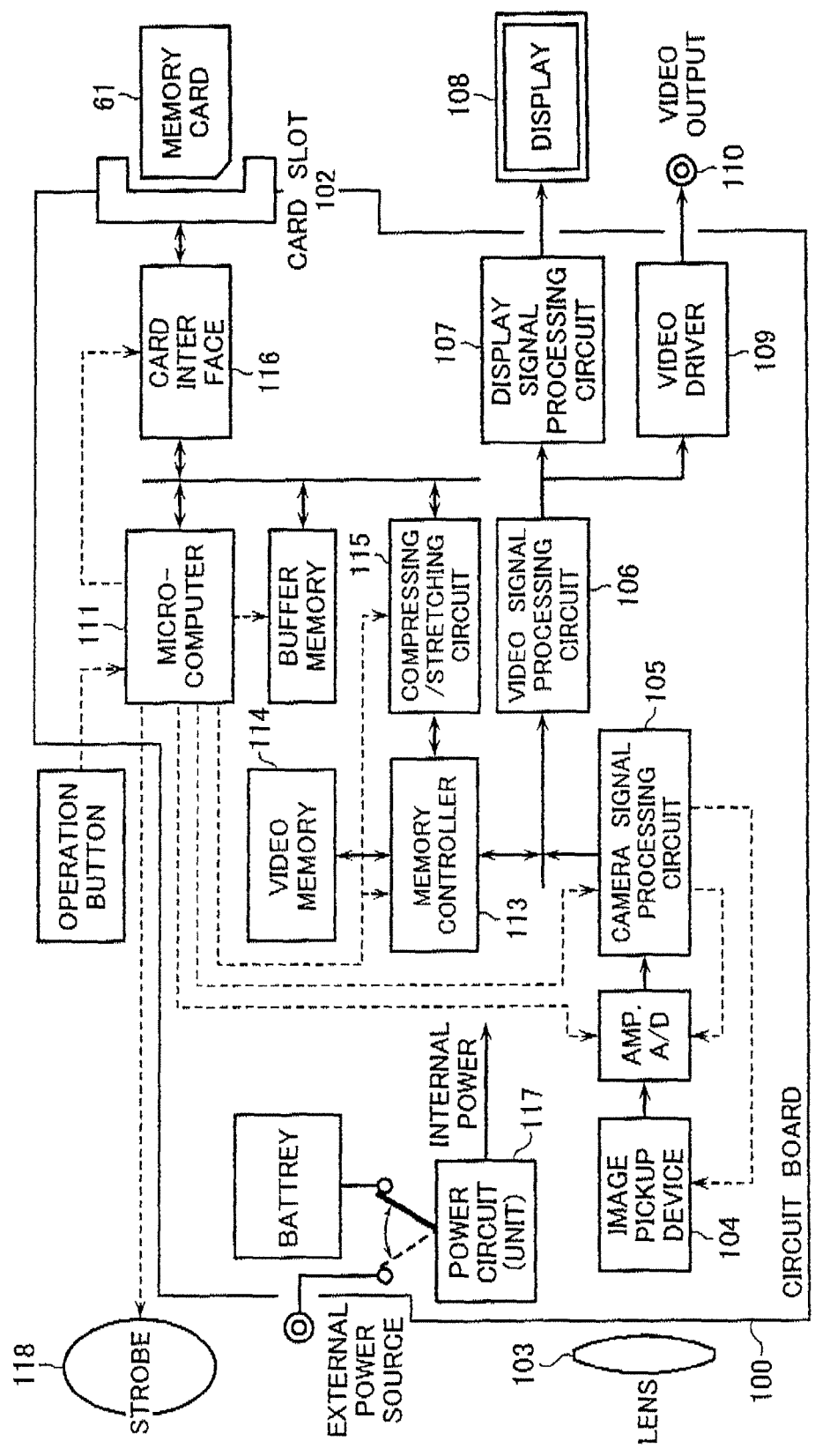
FIG. 28 shows an internal configuration of the digital still camera.
Figure 29A:
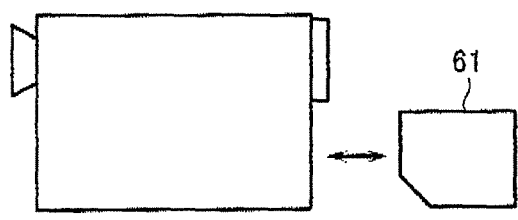
FIGS. 29A to 29J show other electric devices to which the embodiment is applied.
Figure 29F:
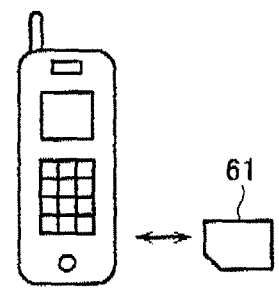
Figure 29B:
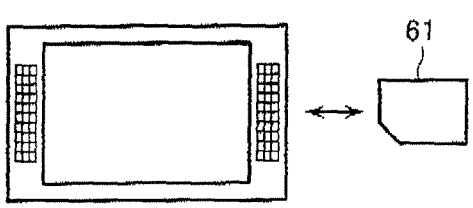
Figure 29G:
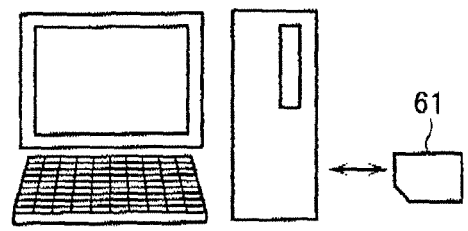
Figure 29C:
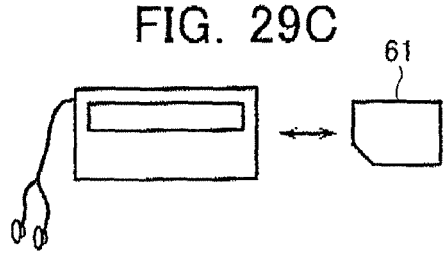
Figure 29H:
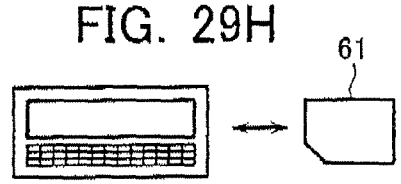
Figure 29D:
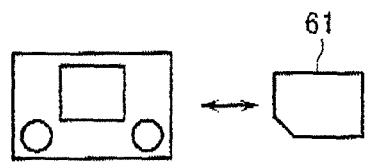
Figure 29I:
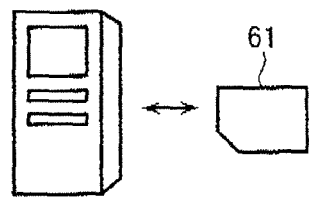
Figure 29E:
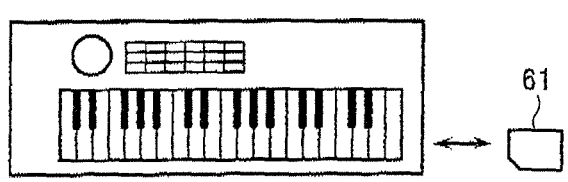
Figure 29J:
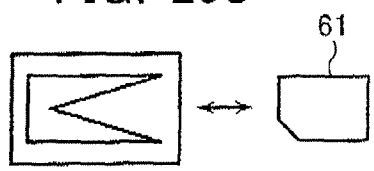

FIG. 28 shows a basic, arrangement of the digital still camera. Light from an object is converged by a lens 103 and input to an image pickup device 104. The image pickup device 104 is, for example, a CMOS sensor and photoelectrically converts the input light to output, for example, an analog signal. This analog signal is amplified by an analog amplifier (AMP), and converted into a digital signal by an A/D converter (A/D). The converted signal is input to a camera signal processing circuit 105 where the signal is subjected to automatic exposure control (AS), automatic white balance (AWB) control, color separation, and the like, and converted into a luminance signal and color difference signals.

To monitor the image, the output signal from the camera processing circuit 105 is input to a video signal processing circuit 106 and converted into a video signal. The system of the video signal is, e.g., NTSC (National Television System Committee). The video signal is input to a display 108 attached to the digital still camera 101 via a display signal processing circuit 107. The display 108 is, e.g., a liquid crystal monitor.

The video signal is supplied to a video output terminal 110 via a video driver 109. An image picked up by the digital still camera 101 can be output to an image apparatus such as a television set via the video output terminal 110. This allows the pickup image to be displayed on an image apparatus other than the display 108. A microcomputer 111 controls the image pickup device 104, analog amplifier (AMP), A/D converter (A/D), and camera signal processing circuit 105.

To capture an image, an operator presses an operation button such as a shutter button 112. In response to this, the microcomputer 111 controls a memory controller 113 to write the output signal from the camera signal processing circuit 105 into a video memory 114 as a flame image. The flame image written in the video memory 114 is compressed on the basis of a predetermined compression format by a compressing/stretching circuit 115. The compressed image is recorded, via a card interface 116, on the memory card 61 inserted in the card slot.

To reproduce a recorded image, an image recorded on the memory card 61 is read out via the card interface 116, stretched by the compressing/stretching circuit 115, and written into the video memory 114. The written image is input to the video signal processing circuit 106 and displayed on the display 108 or another image apparatus in the same manner as when image is monitored.

In this arrangement, mounted on the circuit board 100 are the card slot 102, image pickup device 104, analog amplifier (AMP), A/D converter (A/D), camera signal processing circuit 105, video signal processing circuit 106, display signal processing circuit 107, video driver 109, microcomputer 111, memory controller 113, video memory 114, compressing/stretching circuit 115, and card interface 116.

The card slot 102 need not be mounted on the circuit board 300, and can also be connected to the circuit board 100 by a connector cable or the like.

A power circuit 117 is also mounted on the circuit board 100. The power circuit 117 receives power from an external power source or battery and generates an internal power source voltage used inside the digital still camera 101. For example, a DC-DC converter can be used as the power circuit 117. The internal power source voltage is supplied to the respective circuits described above, and to a strobe 118 and the display 108.

As described above, the electric card according to this embodiment can be used in portable electric devices such as the digital still camera explained above. However, the electric card can also be used in various apparatus such as shown in FIGS. 29A to 29J, as well as in portable electric devices. That is, the electric card can also be used in a video camera shown in FIG. 29A, a television set shown in FIG. 29B, an audio apparatus shown in FIG. 29C, a game apparatus shown in FIG. 29D, an electric musical instrument shown in FIG. 29E, a cell phone shown in FIG. 29F, a personal computer shown in FIG. 29G, a personal digital assistant (PDA) shown in FIG. 29H, a voice recorder shown in FIG. 29I, and a PC card shown in FIG. 29J.

Additional advantages and modifications will readily occur to those skilled in the arts Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory device having a built-in error detection and correction system, wherein
the error detection and correction system is formed to have a cyclic code, with which multiple error bits are correctable, wherein
the cyclic code is configured in such a manner that an information polynomial of degree k-1 has k terms (k is a maximal number of t-bit error correctable bits capable of being utilized as information bits) including d ($=2^m$, m: integer, d<k) terms being actually used as information bits and k-d terms being fixed as terms of "0", and wherein
the "0"-fixed terms are selected in such manner that the computation amount of syndrome calculation decreases.

2. The semiconductor memory device according to claim 1, wherein
the error detection and correction system is formed to have a t($\geq$2)-bit error correction BCH code over Galois field $GF(2^m)$, and wherein
the BCH code is configured in such a manner that the d degrees of the information polynomial are derived from the least side in a total sums of coefficient "1" of remainder polynomials used for calculation of multiple syndrome polynomials.

3. The semiconductor memory device according to claim 1, wherein
the error detection and correction system is formed to have a 2-bit error correction BCH code over Galois field $GF(2^8)$, and wherein
the BCH code is configured in such a manner that 128 degrees of the information polynomial are derived from the least side in a total sums of coefficient "1" of remainder polynomials obtained from $X^m$ (m=16 to 254) derived by irreducible polynomial used for calculation of multiple syndrome polynomials.

4. The semiconductor memory device according to claim 3, wherein the error detection and correction system includes an error location searching part, and wherein
the error location searching part comprises:
a first data bus, to which coefficient data of syndrome polynomials $S_1(x)$ and $S_3(x)$ are output;

255 arithmetic processing units, in which first arithmetic operation $p''(x)S_1(x)$ and second arithmetic operation $(S_1(x))^2+S_3(x^3)/S_1(x)$ are simultaneously executed in parallel within 144 units selected based on the coefficient data on the first data bus, the first arithmetic operation being executed between an error bit-corresponding division remainder $p''(x)$ and syndrome polynomial $S_1(x)$ on the first data bus, the second arithmetic operation being executed for syndrome polynomials only;

a second data bus for outputting a calculation result of the second arithmetic operation in the arithmetic processing units;

144 parity check units operative to perform an adding operation between the data on the second data bus and the calculation result of the first arithmetic operation of the processing units; and a decoder configured to compare these processing results of the parity check units with $p^{2n}(x)$ to obtain a matched error bit location "n".

5. The semiconductor memory device according to claim 4, wherein said error detection and correction system further includes an error correcting part, and wherein the error correcting part comprises:

a three-bit parity check circuit configured to perform addition processing between the calculation result of the first arithmetic operation in the error position searching circuit, coefficients $S_1(x)^2$ and $S_3(x)/S_1(x)$ on the second data bus; and an inverter circuit for inverting a read data bit in accordance with the processing result of the three-bit parity check circuit.

6. The semiconductor memory device according to claim 1, wherein the device is a non-volatile semiconductor memory with electrically rewritable and non-volatile memory cells arranged therein.

7. The semiconductor memory device according to claim 6, wherein the non-volatile semiconductor memory comprises a cell array with NAND strings arranged therein, the NAND string including a plurality of memory cells connected in series.

8. A semiconductor memory device having a built-in error detection and correction system, which detects and corrects 2-bit errors by use of a BCH code, wherein the error detection and correction system comprises:

an encoding part configured to generate check bits to be written into the cell array of the device together with to-be-written data;

a syndrome operating part configured to execute syndrome operation for read out data from the cell array;

an error location searching part configured to search error locations based on the operation result of the syndrome operating part; and an error correcting part configured to invert a read out data bit at an error location detected in the error location searching part, and output it, and wherein the encoding part is for dividing 254-degree data polynomial $f(x)x^{16}$ configured with to-be-written data being coefficients thereof by code generation polynomial $g(x)$ defined as a product of two 8-degree primitive polynomials $m_1(x)$ and $m_3(x)$, which are prime with each other on Galois field $GF(2^8)$, to obtain 15-degree remainder polynomial $r(x)$, thereby selecting 16 coefficients thereof as check bits, and in the encoding part, M+16 (M "255-16=239) terms corresponding to 16 check bits and M data bits to be error-corrected are selected from the data polynomial in such a way that the calculation scale in the syndrome operating part is made as small as possible.

9. The semiconductor memory device according to claim 8, wherein in the encoding part, based on a coefficient table of 15-degree remainder polynomial $r(x)$, the M+16 terms corresponding to the check bits and data bits are selected in order from the least side of total numbers of degrees with coefficient "1".

10. The semiconductor memory device according to claim 9, wherein the 16 check bits are generated via parity check for the coefficients of the degrees selected in the data polynomial $f(x)x^{16}$.

11. The semiconductor memory device according to claim 8, wherein the error location searching part comprises:

a first data bus, to which coefficient data of syndrome polynomials $S_1(x)$ and $S_3(x)$ are output;

255 arithmetic processing units, in which first arithmetic operation $p''(x)S_1(x)$ and second arithmetic operation $(S_1(x))^2+S_3(x^3)/S_1(x)$ are simultaneously executed in parallel within 144 units selected based on the coefficient data on the first data bus, the first arithmetic operation being executed between an error bit-corresponding division remainder $p''(x)$ and syndrome polynomial $S_1(x)$ on the first data bus, the second arithmetic operation being executed for syndrome polynomials only;

a second data bus for outputting a calculation result of the second arithmetic operation in the arithmetic processing units;

144 parity check units operative to perform an adding operation between the data on the second data bus and the calculation result of the first arithmetic operation of the processing units; and a decoder configured to compare these processing results of the parity check units with $p^{2n}(x)$ to obtain a matched error bit location "n".

12. The semiconductor memory device according to claim 8, wherein the error correcting part comprises:

a three-bit parity check circuit configured to perform addition processing between the calculation result of the first arithmetic operation in the error location searching part, coefficients $S_1(x)^2$ and $S_3(x)/S_1(x)$ on the second data bus; and an inverter circuit for inverting a read data bit in accordance with the processing result of the three-bit parity check circuit.

13. The semiconductor memory device according to claim 8, wherein the device is a non-volatile semiconductor memory with electrically rewritable and non-volatile memory cells arranged therein.

14. The semiconductor memory device according to claim 13, wherein the non-volatile semiconductor memory comprises a cell array with NAND strings arranged therein, the NAND string including a plurality of memory cells connected in series.

* * * * *